United States Patent
Tsuda et al.

(10) Patent No.: US 6,909,120 B2
(45) Date of Patent: Jun. 21, 2005

(54) NITRIDE SEMICONDUCTOR LUMINOUS ELEMENT AND OPTICAL DEVICE INCLUDING IT

(75) Inventors: Yuhzoh Tsuda, Tenri (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/415,699

(22) PCT Filed: Nov. 5, 2001

(86) PCT No.: PCT/JP01/09668

§ 371 (c)(1),
(2), (4) Date: Oct. 22, 2003

(87) PCT Pub. No.: WO02/39555

PCT Pub. Date: May 16, 2002

(65) Prior Publication Data

US 2005/0095768 A1 May 5, 2005

(30) Foreign Application Priority Data

Nov. 10, 2000 (JP) .................. 2000-343443
Nov. 15, 2000 (JP) .................. 2000-348103

(51) Int. Cl.⁷ ........................................ H01L 27/15
(52) U.S. Cl. .................. 257/79; 257/94; 257/101; 257/103
(58) Field of Search .................. 257/79–103

(56) References Cited

U.S. PATENT DOCUMENTS 6,472,680 B1 * 10/2002 Takayama et al. ............ 257/14
6,542,526 B1 * 4/2003 Niwa et al. .................. 372/45

FOREIGN PATENT DOCUMENTS

| JP | 07094430 A | 4/1995 |
|---|---|---|
| JP | 08316581 A | 11/1996 |
| JP | 10242585 A | 9/1998 |
| JP | 10270804 A | 10/1998 |
| JP | 11204880 A | 7/1999 |
| JP | 2000124500 A | 4/2000 |
| JP | 2000133884 A | 5/2000 |
| JP | 2000232239 A | 8/2000 |
| JP | 2001085796 A | 3/2001 |
| WO | WO 97/11518 | 3/1997 |

OTHER PUBLICATIONS

U.S. Appl. No. 10/381,113, filed Mar. 20, 2003, Tsuda et al.

* cited by examiner

Primary Examiner—Long Pham
Assistant Examiner—Wai-Sing Louie
(74) Attorney, Agent, or Firm—Morrison & Foerster LLP

(57) ABSTRACT

According to an aspect of the present invention, a nitride semiconductor light emitting device includes a light emitting layer having a quantum well structure with quantum well layers and barrier layers laminated alternately. The well layer is formed of a nitride semiconductor containing In, and the barrier layer is formed of a nitride semiconductor layer containing As, P or Sb. According to another aspect of the present invention, a nitride semiconductor light emitting device includes a light emitting layer having a quantum well structure with quantum well layers and barrier layers laminated alternately. The well layer is formed of $GaN_{1-x-y-z}As_xP_ySb_z$ ($0<x+y+z\leq0.3$), and the barrier layer is formed of a nitride semiconductor containing In.

32 Claims, 18 Drawing Sheets

NITRIDE SEMICONDUCTOR LUMINOUS ELEMENT AND OPTICAL DEVICE INCLUDING IT

TECHNICAL FIELD

The present invention relates to nitride semiconductor light emitting devices, and more particularly to a nitride semiconductor light emitting device improved in luminous efficiency.

BACKGROUND ART

Japanese Patent Laying-Open No. 10-270804 discloses a nitride semiconductor light emitting device having a light emitting layer including GaNAs (or GaNP or GaNSb) quantum well layers and GaN barrier layers. Further, Japanese Patent Laying-Open No. 11-204880 discloses a nitride semiconductor light emitting device having a light emitting layer including InGaNAs well layers and GaN barrier layers and emitting light of a wavelength of more than 450 nm.

However, the inventors have found that, with these nitride semiconductor light emitting devices of the prior art, it is difficult to improve steepness in composition change at the interface (hereinafter, referred to as "interfacial steepness") between the well and barrier layers included in the light emitting layer even if their growth conditions (including growth temperature) are controlled. Insufficient interfacial steepness between the well and barrier layers causes increase of half-width of emission peak, increase of color mottling, and degradation of luminous intensity (or gain reduction) in the light emitting device. Further, the fact that it is difficult to improve the interfacial steepness between the well and barrier layers means that it is difficult to form a multiple quantum well structure including a plurality of well and barrier layers. Such problems are commonly seen in nitride semiconductor light emitting devices having light emitting layers including GaNAs well layers/GaN barrier layers, GaNP well layers/GaN barrier layers, GaNSb well layers/GaN barrier layers, InGaNAs well layers/GaN barrier layers, InGaNP well layers/GaN barrier layers, InGaNSb well layers/GaN barrier layers and others.

DISCLOSURE OF THE INVENTION

In view of the above-described problems of the prior art, an object of the present invention is to improve interfacial steepness between well and barrier layers and hence to decrease threshold current density or improve luminous intensity in a nitride semiconductor light emitting device.

According to the present invention, a nitride semiconductor light emitting device formed on a substrate has a light emitting layer including a quantum well layer and a barrier layer in contact with the well layer. The well layer is formed of a nitride semiconductor containing Ga, N and an element X, and the element X includes at least one element selected from As, P and Sb. The well layer has an atomic fraction X/(N+X) of less than 30%. The barrier layer is formed of a nitride semiconductor containing Ga, N and an element Y, and the element Y includes at least one element selected from As, P and Sb.

The well layer may further include In, in which case the atomic fraction X/(N+X) is preferably less than 20%.

The element X and the element Y may be the same element. A dose of the element Y is preferably more than $1 \times 10^{16}/cm^3$.

The substrate is preferably a nitride semiconductor substrate or a pseudo GaN substrate. An etch pit density of the substrate is preferably less than $7 \times 10^7/cm^2$.

The well layer preferably has a thickness of more than 0.4 nm and less than 20 nm, and the barrier layer preferably has a thickness of more than 1 nm and less than 40 nm.

The light emitting layer preferably includes at least one impurity selected from Si, O, S, C, Ge, Zn, Cd and Mg, and a total dose of the impurity is preferably more than $1 \times 10^{16}/cm^3$ and less than $1 \times 10^{20}/cm^3$.

The number of the well layers is preferably at most 10, and preferably at least 2.

An atomic fraction Y/(N+Y) is preferably equal to the atomic fraction N/(N+X). The atomic fraction Y/(N+Y) is preferably more than $2 \times 10^{-5}\%$.

Among the nitride semiconductor light emitting devices as described above, a nitride semiconductor laser device having a laser wavelength of more than 380 nm and less than 420 nm can preferably be used in an optical pickup apparatus. Further, among the nitride semiconductor light emitting devices as described above, a light emitting diode device or a super-luminescent diode device having an emission wavelength of more than 3.60 nm and less than 420 nm can preferably be used in a white light source apparatus. Still further, among the nitride semiconductor light emitting devices as described above, a light emitting diode device having an emission wavelength of more than 450 nm and less than 480 nm and a half-width of emission peak of less than 40 nm can preferably be used in a display apparatus.

BEST MODES FOR CARRYING OUT THE INVENTION

Figure 1:
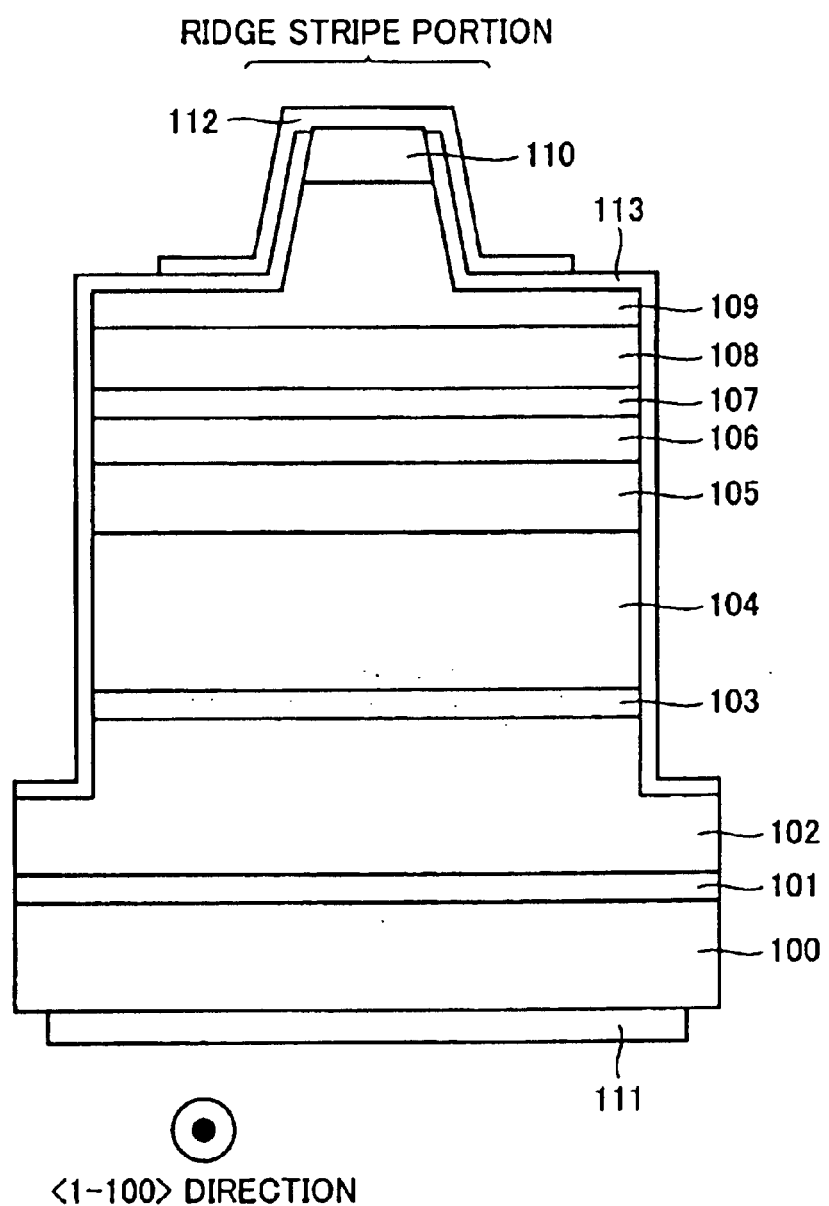
FIG. 1 is a schematic cross sectional view showing a structure of a nitride semiconductor laser device according to an embodiment of the present invention.

Firstly, description is given as to how the inventors found problems of conventional nitride semiconductor light emitting devices and how they have reached the present invention. Embodiments of the present invention will be described thereafter.

To examine details of the GaNAs well layer/GaN barrier layer structure included in the light emitting layer of the nitride semiconductor light emitting device disclosed in Japanese Patent Laying-Open No. 10-270804, the inventors carried out analysis of the same structure by SIMS (secondary ion mass spectroscopy). When the well layer and the barrier layer were both formed at a temperature in a growth temperature range (600–800° C.) suitable for the GaNAs well layer, the As concentration changed steeply at the interface of GaNAs well layer/GaN barrier layer, while the steepness of the As concentration change was considerably impaired at the interface of GaN barrier layer/GaNAs well layer.

On the other hand, when the GaNAs well layer was formed at a temperature in the growth temperature range (600–800° C.) suitable therefor and the GaN barrier layer was formed at a growth temperature (higher than 900° C.) suitable therefor, the As concentration changed steeply at the interface of GaN barrier layer/GaNAs well layer, whereas the steepness of the As concentration change was considerably impaired at the interface of GaNAs well layer/GaN barrier layer, contrary to the above case.

It was found from the foregoing that, no matter how the growth conditions (growth temperatures) of the GaNAs well layer and the GaN barrier layer included in the light emitting layer of the conventional nitride semiconductor device were controlled, it would be difficult to improve the steepness of As concentration change at the GaNAs well layer/GaN barrier layer interface and the steepness of As concentration change at the GaN barrier layer/GaNAs well layer interface at the same time. Poor interfacial steepness between the well and barrier layers causes increase of the half-width of emission peak Beading to increase of color mottling in the light emitting device) and decrease of luminous efficiency (leading to increase of threshold current density or decrease of luminous intensity) attributable to the degraded interfacial characteristics. In addition, impairment of the interfacial steepness between the well and barrier layers suggests difficulty in forming a multiple quantum well structure including a plurality of well and barrier layers.

The inventors also carried out the SIMS analysis of the InGaNAs well layer/GaN barrier layer structure included in the light emitting layer of the nitride semiconductor light emitting device disclosed in Japanese Patent Laying-Open No. 11-204880, and obtained the similar results as in the case of the GaNAs well layer/GaN barrier layer structure.

The above-described problem of poor interfacial steepness between the well and barrier layers occurs not only in the GaNAs well layer/GaN barrier layer structure and the InGaNAs well layer/GaN barrier layer structure, but also in GaNP well layer/GaN barrier layer structure, GaNSb well layer/GaN barrier layer structure, InGaNP well layer/GaN barrier layer structure, and InGaNSb well layer/GaN barrier layer structure.

First Embodiment (Light Emitting Layer)

To solve the problem (of interfacial steepness) of the conventional light emitting layer as described above, in a first embodiment of the present invention, a GaN barrier layer in contact with a GaNX well layer (containing at least one element selected from As, P and Sb as an element X, and having an atomic fraction X/(N+X) of less than 30%) contains a third element Y. At least one element selected from As, P and Sb can be contained as the element Y. Hereinafter, such a barrier layer is referred to as the GaNY barrier layer.

Figure 12:
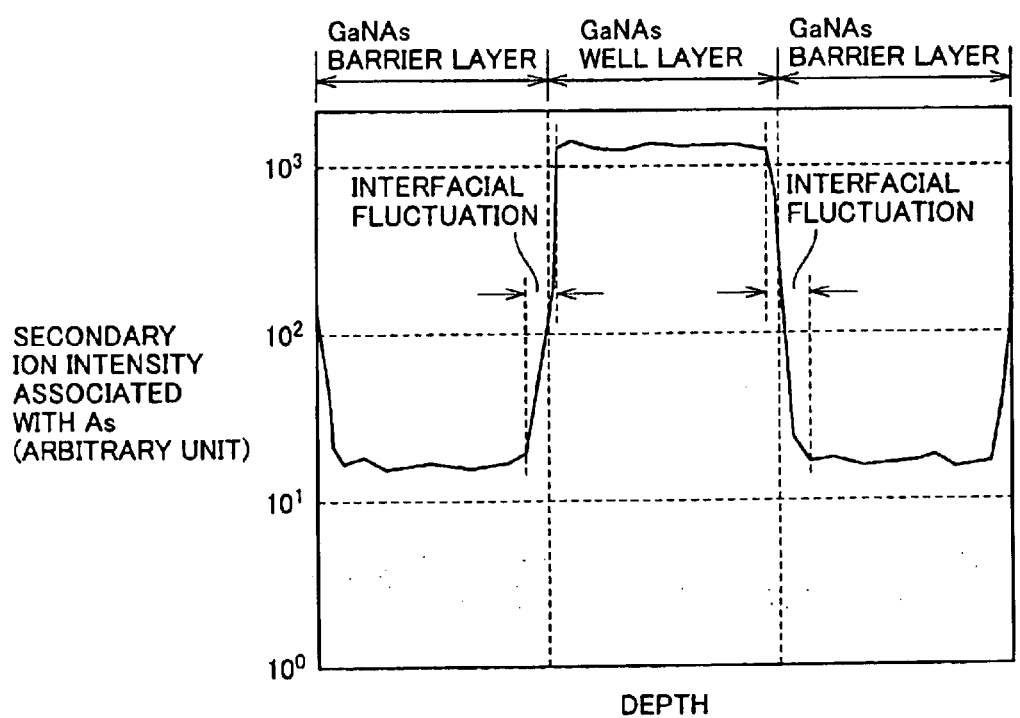
FIG. 12 is a graph showing a SIMS result associated with As within a GaNAs barrier layer/GaNAs well layer/GaNAs barrier layer structure in the nitride semiconductor light emitting device of the present invention.

FIG. 12 shows a result of SIMS carried out in the light emitting layer including GaNAs well layers/GaNAs barrier layers in the present embodiment. In FIG. 12, the well and barrier layers were formed at the same growth temperature (800° C.). As seen from the drawing, interfacial steepness between the well and barrier layers is improved by using the GaNAs barrier layer containing As as the element Y. This means that it is possible to form a multiple quantum well structure including a plurality of well and barrier layers.

Since the light emitting layer of the nitride semiconductor light emitting device according to the present embodiment does not contain In, it does not cause the problems of color mottling and degradation in luminous intensity of the light emitting device attributable to phase separation of In.

The above-described effects of the present embodiment can be obtained not only for the GaNAs well layer/GaNAs barrier layer structure, but also for any GaNX well layer/GaNY barrier layer structure. The GaNX well layer may be GaNP, GaNSb, GaNAsP, GaNAsPSb or the like, and the GaNY barrier layer may be GaNAs, GaNP, GaNSb, GaNAsP, GaNAsPSb or the like.

In these mixed crystals, a ternary mixed crystal of GaNAs, GaNP or GaNSb is easy of controlling its composition ratio compared to a quaternary mixed crystal of GaNAsP or a quinary mixed crystal of GaNAsPSb, and thus makes it possible to form a light emitting device having an intended emission wavelength with good reproducibility.

The ternary mixed crystal of GaNP contains P having an atomic radius (Van der Waals radius or covalent bond radius) closest to that of N among P, As and Sb. Thus, P atoms are more likely to be substituted with some of N atoms in the mixed crystal, as compared to As or Sb atoms. Then, it is not likely that crystallinity of the GaN crystal is impaired by the addition of P. This means that crystallinity of the mixed crystal GaNP will not be degraded even if the composition ratio of P increases. Therefore, it is advantageous to use GaNP for the well layer of the light emitting device in order to realize light emission in a wide wavelength band from ultraviolet to red.

GaNSb contains Sb having the largest atomic radius among P, As and Sb compared to N. This prevents highly volatile N atoms from escaping from the mixed crystal, which is preferable for improvement of crystallinity.

GaNAs contains As having an intermediate atomic radius among P, As and Sb, and is preferable in view of having both characteristics of GaNP and GaNSb.

(Barrier Layer)

Figure 11A:
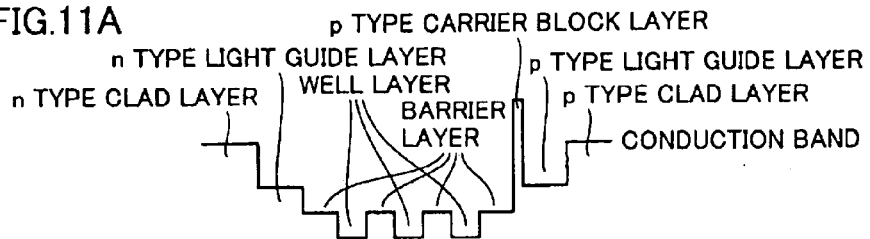
FIG. 11A shows a bandgap structure of a light emitting layer including a multiple quantum well structure starting and ending with barrier layers.
Figure 11A:
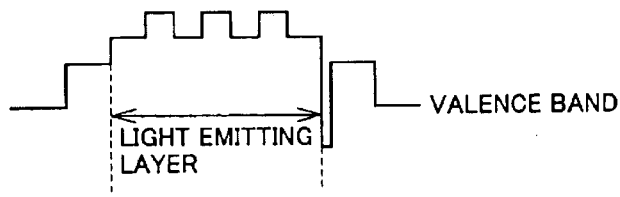
Figure 11B:
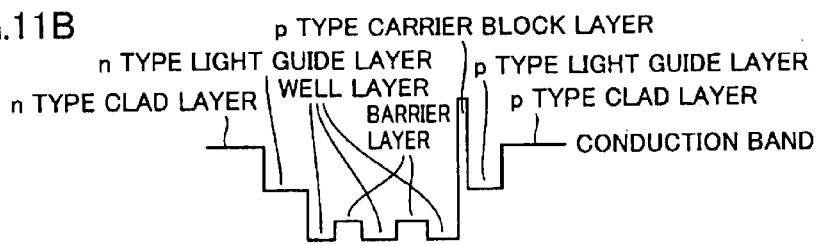
FIG. 11B shows a bandgap structure of a light emitting layer including a multiple quantum well structure starting and ending with well layers.
Figure 11B:
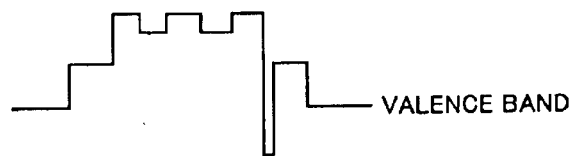
Figure 11C:
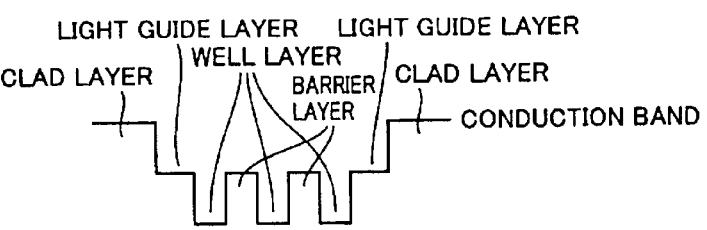
FIG. 11C shows a bandgap structure of a light emitting layer including a conventional multiple quantum well layer (Japanese Patent Laying-Open No. 10-270804).
Figure 11C:
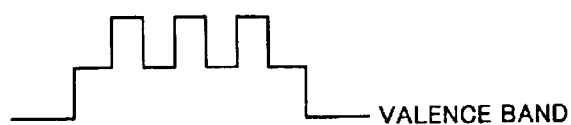

FIGS. 11A and 11B show bandgap structures applicable to the light emitting layer of the nitride semiconductor light emitting device according to the present embodiment. FIG. 11A shows the bandgap structure of the light emitting layer having a multiple quantum well structure starting with a barrier layer and ending with a barrier layer. FIG. 11B shows the bandgap structure of the light emitting layer having a multiple quantum well structure starting with a well layer and ending with a well layer. FIG. 11C shows the bandgap structure of the light emitting layer according to Japanese Patent Laying-Open No. 10-270804.

Since the barrier layer of the present embodiment is formed of GaNY, the bandgap energy can be made smaller than that of the GaN light guide layer (see FIGS. 11A and 11B). Accordingly, the multiple quantum well effect due to sub-bands can be readily obtained compared to the conventional light emitting layer (FIG. 11C), the refractive index of the light emitting layer becomes greater than that of the light guide layer, leading to improved light confinement efficiency, and the (unimodal) characteristic of the vertical transverse mode is also improved.

(Dose of Element X in GaNX Well Layer)

The GaNX well layer of the present embodiment has an atomic fraction X/(N+X) (hereinafter, called "atomic fraction of element X") of less than 30%, preferably less than 20%, and more preferably less than 10%, for the following reasons. If the atomic fraction of element X is greater than 20%, phase separation (concentration separation) begins to gradually occur and thus the atomic fraction of element X becomes different in local regions within the well layer. Further, if the atomic fraction of element X exceeds 30%, the concentration separation proceeds to crystal system separation into a hexagonal system and a cubic system. Such crystal system separation considerably impairs the interfacial steepness between the well and barrier layers. Further, if the ratio of regions suffering the crystal system separation becomes more than about 50% in the well layer, crystallinity of the well layer will also be degraded considerably.

The lower limit of the atomic fraction of element X is at least 0.01%, and preferably at least 0.1%. This is because, if it is less than 0.01%, it is almost impossible to obtain the effect of adding element X in the well layer (reduction of threshold current density or improvement of luminous intensity). The atomic fraction of element X is preferably more than 0.1% in order to surely have the effect of addition of element X in the well layer.

(Dose of Element Y in GaNY Barrier Layer)

To find a preferable dose of element Y in the GaNY barrier layer, it was examined how the dose of element Y affect the interfacial steepness between the well and barrier layers.

Figure 13:
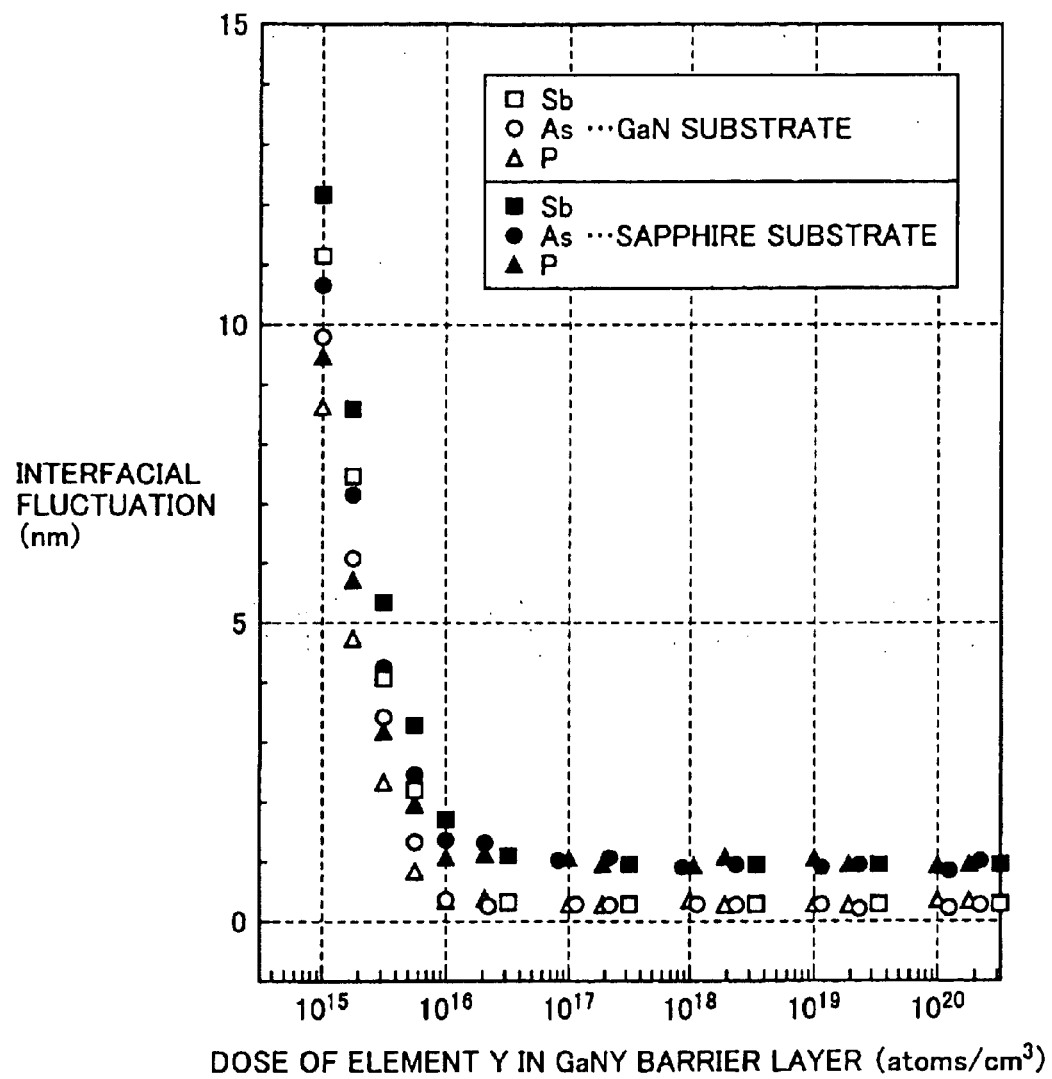
FIG. 13 is a graph showing the relation between the dose of element Y in a GaNY barrier layer in contact with a GaNAs well layer and the interfacial fluctuation.

FIG. 13 shows measurement results of interfacial fluctuation in the case that element Y was added to the GaN barrier layer within the GaN barrier layer/GaNAs well layer structure. In this case, As, P or Sb was added as element Y. A GaN substrate or a sapphire substrate was used as the substrate.

Figure 14:
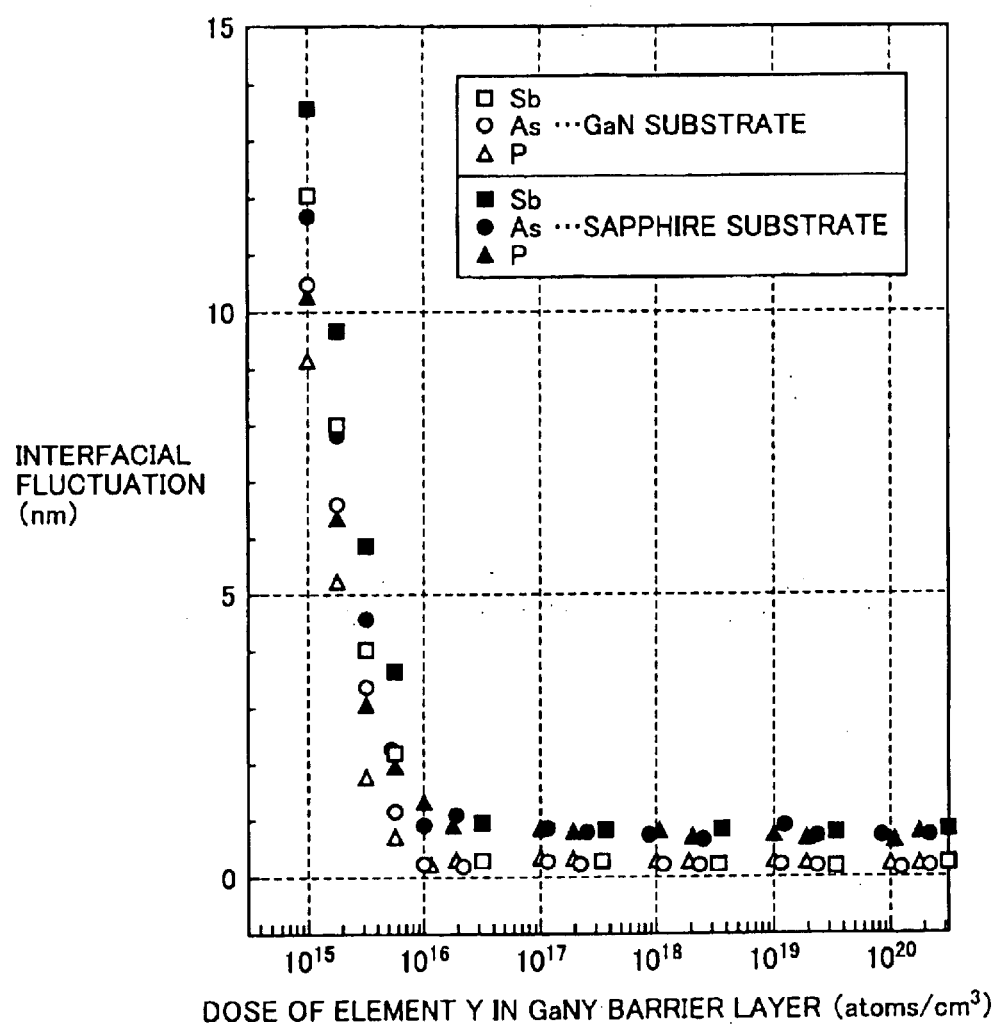
FIG. 14 is a graph showing the relation between the dose of element Y in a GaNY barrier layer in contact With a GaNP well layer and the interfacial fluctuation.

FIG. 14 shows, similarly to FIG. 13, measurement results of interfacial fluctuation in the case that element Y was added to the GaN barrier layer within the GaN barrier layer/GaNP well layer structure.

Here, the interfacial fluctuation is represented as a depth (or thickness) from a point of the maximum secondary ion intensity in the SIMS measurement to another point of the minimum intensity or the other way about (see FIG. 12). In FIGS. 13 and 14, the interfacial fluctuation is shown as an average value of the interfacial fluctuations at such a well layer/barrier layer interface and a barrier layer/well layer interface as shown in FIG. 12. Further, black marks in the graphs represent interfacial fluctuations with respect to doses of element Y in the light emitting device formed on a sapphire substrate (as an example of the substrate other than the nitride semiconductor substrate), and white marks represent interfacial fluctuations with respect to doses of element Y in the light emitting device formed on a GaN substrate (as an example of the nitride semiconductor substrate).

As seen from FIGS. 13 and 14, the interfacial fluctuation can be suppressed if the total dose of element Y is more than $1 \times 10^{16}/cm^3$ (more than $2 \times 10^{-5}\%$ in terms of the atomic fraction of element Y), irrespective of the element species of As, P or Sb. The upper limit of the atomic fraction of element Y is preferably at most 15%. By the way, the energy gap of the well layer needs to be smaller than that of the barrier layer. Preferably, the bandgap energy of the barrier layer is made more than 0.1 eV greater than that of the well layer. Good crystallinity can be maintained when the atomic fraction of element Y is less than 15%.

As shown in FIGS. 13 and 14, the interfacial fluctuation in the light emitting layer that was crystal grown using a GaN substrate was smaller than in the case of using a sapphire substrate, the reason of which will be described in detail in a later item (Substrate for Growing Light Emitting Device). The relation between the dose of element Y and the interfacial fluctuation in the case using the pseudo GaN substrate was approximately the same as in the case of using the GaN substrate. Since the pseudo GaN substrate includes coexistent portions of high defect density and of low defect density, it is liable to degrade the yield of the light emitting devices. On the other hand, the pseudo GaN substrate has an advantage that one having a large area can be manufactured at low costs compared to the nitride semiconductor substrate. The effects described in conjunction with FIGS. 13 and 14 can be obtained with any well layer of GaNX, not limited to GaNAs or GaNP.

(Thickness of Light Emitting Layer)

The GaNX well layer in the light emitting layer preferably has a thickness of more than 0.4 nm and less than 20 nm. If the GaNX well layer is thinner than 0.4 nm, the carrier confining level by the quantum well effect becomes too high, possibly degrading luminous efficiency. If the GaNX well layer is thicker than 20 nm, the interfacial steepness between the well and barrier layers begins to degrade, though it depends on the atomic fraction of element X. This is presumably because phase separation due to element X slightly occurs even if the atomic fraction of element X in the GaNX well layer is less than 20%, and the regions suffering such phase separation gradually increase as the thickness of the well layer increases. This leads to an irregular surface of the well layer or even proceeds to crystal system separation.

The GaNY barrier layer in the light emitting layer has a thickness of preferably more than 1 nm and less than 40 nm, and more preferably more than 1 nm and less than 20 nm. If the GaNY barrier layer is thinner than 1 nm, it is difficult to fully confine the carriers within the well layer. If the GaNY barrier layer is thicker than 40 nm, the interfacial steepness between the well and barrier layers starts to degrade, presumably for the same reasons as in the case of the GaNX well layer described above. The upper limit in thickness of the GaNY barrier layer can be about 20 nm greater than that of the GaNX well layer, because the dose of element Y is smaller than that of element X.

(Combination of GaNX Well Layer and GaNY Barrier Layer)

In the light emitting layer, element X of the GaNX well layer and element Y of the GaNY barrier layer are preferably the same element. When element X and element Y are the same, it is unnecessary to change the source material for the group V elements in depositing the well layer and the barrier layer (eliminating a time lag required for the change of source materials), which facilitates formation of the light emitting layer. Further, when elements X and Y are the same, the well and barrier layers can be deposited approximately at the same temperature. These advantages also contribute toward improvement of the interfacial steepness between the well and barrier layers.

As examples of the combination of the well and barrier layers having the same elements X and Y, it is possible to employ GaNAs well layer/GaNAs barrier layer, GaNP well layer/GaNP barrier layer, GaNSb well layer/GaNSb barrier layer, GaNAsP well layer/GaNAsP barrier layer, and GaNAsPSb well layer/GaNAsPSb barrier layer.

(Substrate for Growing Light Emitting Device)

The inventors have found that the interfacial fluctuation between the GaNX well layer and the GaNY barrier layer in the light emitting device changes depending on the substrate for growing the light emitting device. According to the findings of the inventors, As, P or Sb is liable to segregate near lattice defects in the grown crystal. As such, it is considered that proper selection of the substrate can reduce the defect density in the grown crystal and improve the interfacial fluctuation between the well and barrier layers. The reason is because it is considered that the segregation of As, P or Sb near the defects adversely affects the interfacial fluctuation.

Further, according to the findings of the inventors, the most preferable substrate is a GaN substrate (as an example of the nitride semiconductor substrate). A nitride semiconductor film grown on the GaN substrate had an etch pit density of less than $5 \times 10^7/cm^2$. This is smaller than the etch pit density (more than $4 \times 10^8/cm^2$) in the case of employing a sapphire or SiC substrate (as an example of the substrate other than the nitride semiconductor substrate) conventionally used as a substrate for a nitride semiconductor light emitting device. Here, in measurement of the etch pit density, an epi-wafer (including the light emitting device structure) is immersed in an etchant (at a temperature of 250° C.) of phosphoric acid to sulfuric acid=1:3 for 10 minutes, to form etch pits on the wafer surface. This etch pit density obtained by measuring the pit density on the epi-wafer surface may not exactly show the density of defects in the light emitting layer. However, the measurement of the etch pit density can indicate whether there are a large number of defects in the light emitting layer or not, since the density of defects in the light emitting layer increases as the etch pit density increases.

The next favorable substrate as the nitride semiconductor substrate is a pseudo GaN substrate. The method of forming the pseudo GaN substrate will be described in detail in the subsequent second embodiment. The nitride semiconductor film grown on the pseudo GaN substrate had an etch pit density of less than $7 \times 10^7/cm^2$ in a region of the lowest etch pit density, which is close to the etch pit density of the nitride semiconductor film grown on the GaN substrate (as the nitride semiconductor substrate). However, since the pseudo GaN substrate has coexistent regions of low etch pit density (defect density) and high etch pit density, the yield of the light emitting devices is liable to decrease compared to the case of using the GaN substrate. On the other hand, the pseudo GaN substrate is advantageous in that one having a large area can be formed at low costs.

The light emitting layer grown on a GaN substrate is explained in conjunction with FIGS. 13 and 14 again. As seen from FIGS. 13 and 14, the light emitting layer grown on the GaN substrate includes less interfacial fluctuation than the light emitting layer grown on a sapphire substrate.

It will be described in detail in the following item (Number of Well Layers) how the effect of suppressing interfacial fluctuation by using the GaN substrate contributes to the nitride semiconductor light emitting device. To briefly set forth only the result, as seen from FIGS. 9 and 10, it contributes to reduction of threshold current density in the case of a nitride semiconductor laser device, and contributes to increase of luminous intensity in the case of a light emitting diode. The relation between the dose of element Y and the interfacial fluctuation in the case of using the pseudo GaN substrate was approximately the same as in the case of using the GaN substrate in FIGS. 13 and 14.

(Number of Well Layers)

In the nitride semiconductor light emitting device according to the present embodiment, poor interfacial steepness of GaNAs well layer/GaN barrier layer or the like can be improved. Such improvement of the interfacial steepness between the well and barrier layers enables formation of a desirable multiple quantum well structure including a plurality of well and barrier layers, and then it is expected to improve characteristics of the light emitting device including such a multiple quantum well structure.

Figure 9:
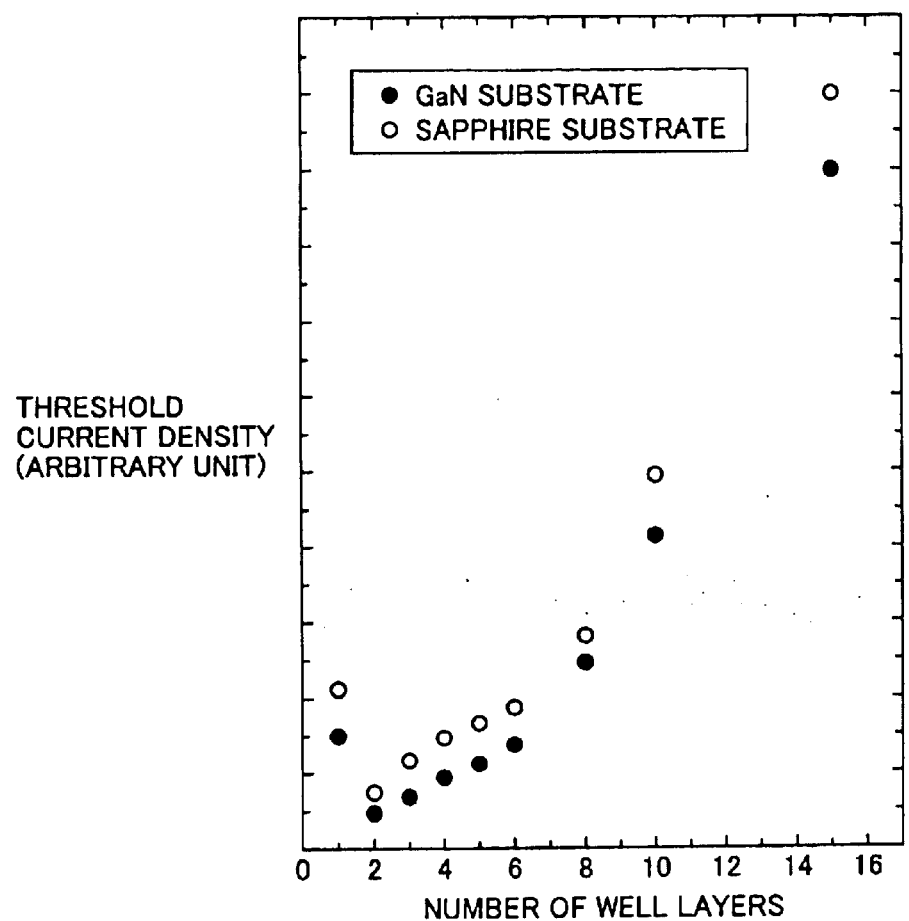
FIG. 9 is a graph showing the relation between the number of well layers and the threshold current density in the nitride semiconductor laser devices according to the present invention.

Description is now given as to how the number of well layers and the kind of substrate affect lasing threshold current density in a nitride semiconductor laser device including a multiple quantum well structure. FIG. 9 shows the relation between the number of well layers constituting the light emitting layer (multiple quantum well structure) and the lasing threshold current density. The light emitting layer used in FIG. 9 includes, a $GaN_{0.97}P_{0.03}$ well layer and a $GaN_{0.99}P_{0.01}$ barrier layer. White circles and black circles in the figure represent lasing threshold current densities in the case of using a sapphire substrate (as an example of the substrate other than the nitride semiconductor substrate) and a GaN substrate (as an example of the nitride semiconductor substrate), respectively. The method of forming the nitride semiconductor laser device on the GaN substrate is the same as will be described in a later item (Method of Forming Nitride Semiconductor Laser). The method of forming the nitride semiconductor laser device on the sapphire substrate is the same as will be described later in the third embodiment.

Referring to FIG. 9, continuous light emission at room temperature was possible when the number of well layers was at most 10, irrespective of the kind of substrate. The well layers of at least 2 and at most 6 were preferable to further reduce the lasing threshold current density. It has been found from the foregoing that a desirable multiple quantum well structure can be obtained by employing the barrier layer of the present embodiment in the nitride semiconductor light emitting device. Further, it has been found that the semiconductor laser device using the GaN substrate has a lower threshold current density than the one using the sapphire substrate, as shown in FIG. 9. The relation between the number of well layers and the threshold current density in the case of the light emitting device formed on a pseudo GaN substrate was almost the same as in the case of the light emitting device formed on the GaN substrate in FIG. 9.

Although the light emitting layer including $GaN_{0.97}P_{0.03}$ well layer/$GaN_{0.99}P_{0.01}$ barrier layer has been explained in conjunction with FIG. 9, the relation between the number of well layers and the threshold current density as in FIG. 9 can be obtained using any other light emitting layer as long as which satisfies the requirements of the present embodiment.

Figure 10:
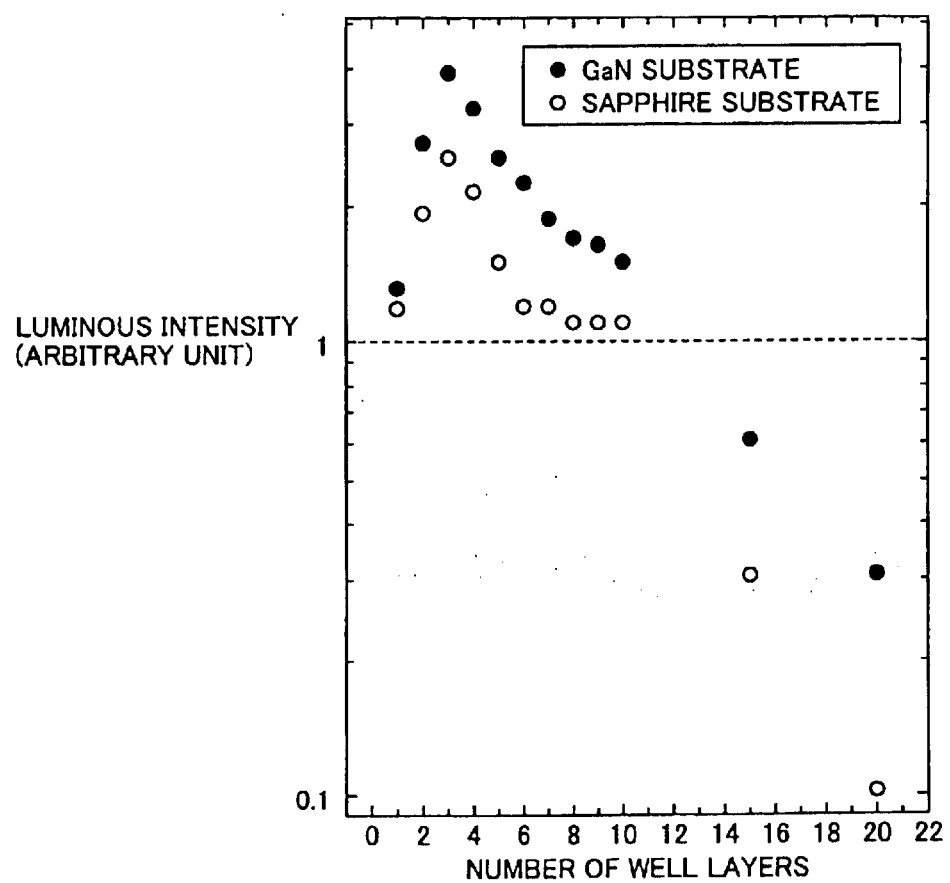
FIG. 10 is a graph showing the relation between the number of well layers and the luminous intensity in the nitride semiconductor light emitting diode devices according to the present invention.

Now, description is given as to how the number of well layers and the kind of substrate affect luminous intensity in a nitride semiconductor light emitting diode device including a multiple quantum well structure. FIG. 10 shows the relation between the number of well layers included in the light emitting layer and the luminous intensity. The light emitting layer used in FIG. 10 includes a $GaN_{0.94}P_{0.06}$ well layer and a $GaN_{0.995}P_{0.005}$ barrier layer. The luminous intensity in FIG. 10 is normalized with the luminous intensity (broken line) of a conventional nitride semiconductor light emitting device including a single quantum well layer of $GaN_{0.94}P_{0.06}$. White circles and black circles in the drawing represent the diode devices formed on a sapphire substrate (as an example of the substrate other than the nitride semiconductor substrate) and a GaN substrate (as an example of the nitride semiconductor substrate), respectively. The methods of forming these light emitting diode devices are the same as will be described below in the fourth embodiment.

When the light emitting layer ($GaN_{0.94}P_{0.06}$ well layer/ GaN barrier layer) in the conventional nitride semiconductor light emitting diode device was replaced with the light emitting layer (number of the well layers was varied from 1 to 20) of the present embodiment, the maximum luminous intensity was about 1.4 times the reference luminous intensity for normalization in FIG. 10. This means that the light emitting layer in the nitride semiconductor light emitting diode device of the present embodiment is superior to the light emitting layer in the conventional light emitting diode device.

Further, as seen from the luminous intensity in FIG. 10, the number of well layers in the nitride semiconductor light emitting diode device is preferably at most 10, and more preferably at least 2 and at most 6, irrespective of the kind of substrate. Further, the luminous intensity becomes higher by using the GaN substrate rather than the sapphire substrate. The relation between the number of well layers and the luminous intensity in the case of using a pseudo GaN substrate was approximately the same as in the case of using the GaN substrate shown in FIG. 10. The similar result as in FIG. 10 can also be obtained in a super-luminescent diode device.

Although the light emitting layer including $GaN_{0.94}P_{0.6}$ well layer/$GaN_{0.995}P_{0.005}$ barrier layer has been explained in FIG. 10, any other light emitting layer satisfying the requirements of the present embodiment can cause the similar relation between the number of well layers and the luminous intensity as shown in FIG. 10.

(Impurity in Light Emitting Layer)

Description is given about addition of impurity into the light emitting layer in the nitride semiconductor light emitting device of the present embodiment. According to photoluminescence (PL) measurement, PL luminous intensity increased to about 1.2–1.4 times when Si was added in the light emitting layer (in both the barrier and well layers). This means that it is possible to improve the characteristics of the light emitting device by adding the impurity in the light emitting layer.

Since the light emitting layer of the present embodiment does not contain In and then a local energy level due to In is not generated, the luminous intensity strongly depends on crystallinity of the well layer (the barrier layer in contact with the well layer also needs to have good crystallinity to ensure good crystallinity of the well layer). As such, it is considered that addition of the impurity Si has served to improve the crystallinity of the light emitting layer. In particular, the effect of improving the crystallinity of the light emitting layer by adding the impurity was remarkable in the case that the crystal growth was performed, e.g., on a sapphire substrate other than the nitride semiconductor substrate, in which case the defect density in the light emitting layer was liable to increase (etch pit density: $4 \times 10^8 /cm^2$ or more).

The similar effects can be obtained by adding at least one selected from O, S, C, Ge, Zn, Cd and Mg, besides Si. All that is needed is that a total dose of impurity is $1 \times 10^{16} /cm^3$ to $1 \times 10^{20} /cm^3$. If the dose of impurity is less than $1 \times 10^{16} /cm^3$, the luminous intensity is not improved. If it is greater than $1 \times 10^{20} /cm^3$, the defect density due to the impurity increases, leading to degradation of the luminous intensity.

(Light Emitting Layer and Emission Wavelength)

The emission wavelength from the light emitting layer of the nitride semiconductor light emitting device of the present embodiment can be changed by adjusting the atomic fraction of element X in the GaNX well layer. For example, ultraviolet light with a wavelength in the vicinity of 380 mm can be obtained with x=0.005 in the case of $GaN_{1-x}As_x$, y=0.01 in the case of $GaN_{1-y}P_y$, and z=0.002 in the case of $GaN_{1-z}Sb_z$. Violet light with a wavelength in the vicinity of 410 nm is obtained with x=0.02 in the case of $GaN_{1-x}As_x$, y=0.03 in the case of $GaN_{1-y}P_y$, and z=0.01 in the case of $GaN_{1-z}Sb_z$. Further, blue light with a wavelength in the vicinity of 470 nm is obtained with x=0.03 in the case of $GaN_{1-x}As_x$, y=0.06 in the case of $GaN_{1-y}P_y$, and z=0.02 in the case of $GaN_{1-z}Sb_z$. Furthermore, green light with a wavelength in the vicinity of 520 nm is obtained with x=0.05 in the case of $GaN_{1-x}As_x$, y=0.08 in the case of $GaN_{1-y}P_y$, and z=0.03 in the case of $GaN_{1-z}Sb_z$. Still further, red light with a wavelength in the vicinity of 650 nm is obtained with x=0.07 in the case of $GaN_{1-x}As_x$, y=0.12 in the case of $GaN_{1-y}P_y$, and z=0.04 in the case of $GaN_{1-z}Sb_z$. An emission wavelength almost as intended can be obtained by selecting a proper atomic fraction of the GaNX well layer taking into account the relation between the color and the atomic fraction as mentioned above.

(Light Emitting Layer and Half-Width of Emission Peak)

Description is given about the half-width of emission peak in the case that the light emitting layer of the present embodiment is used to form such a light emitting diode of the fourth embodiment as will be described later. Here, the half-width of emission peak means a wavelength width at half the maximum luminous intensity in the emission wavelength distribution profile of a light emitting diode operating at room temperature.

In the nitride semiconductor light emitting device of the present embodiment, interfacial steepness between the well and barrier layers is improved compared to a conventional light emitting device, which leads to reduction of the half-width of emission peak. Accordingly, it is possible to form a light emitting device (light emitting diode) sharp in hue with less color mottling. More specifically, a conventional nitride semiconductor light emitting device (including GaNAs well layers and GaN barrier layers) emitting blue light in the wavelength range from about 450 nm to about 480 nm had the half-width of emission peak of 60 nm, or 0.35 eV in terms of energy width. By comparison, a nitride semiconductor light emitting device (including GaNAs well layers and GaNAs barrier layers) of the present embodiment similarly emitting blue light had the half-width of emission peak of 40 nm, or 0.25 eV in terms of energy width.

Although the improvement in half-width of emission peak in the light emitting device including the GaNAs well layers has been described above, the similar improvement can be achieved in a light emitting device including any other well layers, as long as the requirements of the present embodiment are met.

(Method of Forming Nitride Semiconductor Laser Device)

An example of the method of forming the nitride semiconductor laser device in FIG. 1 according to the present embodiment is now explained.

The nitride semiconductor laser device of FIG. 1 includes: a C (0001) plane n type GaN substrate 100; a GaN buffer layer 101; an n type GaN layer 102; an n type $In_{0.07}Ga_{0.93}N$ anti-crack layer 103; an n type $Al_{0.1}Ga_{0.9}N$ clad layer 104; an n type GaN light guide layer 105; a light emitting layer 106; a p type $Al_{0.2}Ga_{0.8}N$ carrier block layer 107; a p type GaN light guide layer 108; a p type $Al_{0.2}Ga_{0.9}N$ clad layer 109; a p type GaN contact layer 110; an n electrode 111; a p electrode 112; and a $SiO_2$ dielectric film 113.

Firstly, n type GaN substrate 100 is set in a MOCVD (metallorganic chemical vapor deposition) system, and $NH_3$ (ammonia) as a source material for group V element and TMGa (trimethylgallium) or TEGa (tryethylgallium) as a source material for group III element are used to grow GaN buffer layer 101 to a thickness of 100 nm at a relatively low substrate temperature of 550° C. Next, $SiH_4$ (silane) is added to the source materials described above to grow n type GaN layer 102 (Si impurity concentration: $1\times10^{18}/cm^3$) to a thickness of 3 μm at a growth temperature of 1050° C. Thereafter, the substrate temperature is lowered to about 700–800° C., and TMIn (trimethylindium) as a source material for group III element is added to grow n type $In_{0.07}Ga_{0.93}N$ anti-crack layer 103 to a thickness of 40 nm. The substrate temperature is raised again to 1050° C., and TMAl (trimethylaluminum) or TEAl (triethylaluminum) as a source material for group III element is used to grow n type $Al_{0.1}Ga_{0.9}N$ clad layer 104 (Si impurity concentration: $1\times10^{18}/cm^3$) to a thickness of 0.8 μm. N type GaN light guide layer 105 (Si impurity concentration: $1\times10^{18}/cm^3$) is then grown to a thickness of 0.1 μm. Thereafter, the substrate temperature is lowered to 800° C., and $PH_3$ or TBP (tertiary butyl phosphine) as a source material for P is added to form light emitting layer (of multiple quantum well structure) 106 including 4 nm thick $GaN_{0.97}P_{0.03}$ well layers and 8 nm thick $GaN_{0.99}P_{0.01}$ barrier layers in order of barrier layer/well layer/barrier layer/well layer/barrier layer/well layer/barrier layer. That is, light emitting layer 106 has 3-cycle well layers. At this time, $SiH_4$ (Si impurity concentration: $1\times10^{18}/cm^3$) is added to both the barrier and well layers. A growth break interval of at least one second and at most 180 seconds may be provided between growth of the barrier layer and growth of the well layer, or between growth of the well layer and growth of the barrier layer. This can improve flatness of the respective layers and also decrease the half-width of emission peak.

$AsH_3$ or TBAs (tertiary butyl arsine) may be used to add As in the light emitting layer, or TMSb (trimethyl antimony) or TESb (triethyl antimony) may be used to add Sb in the light emitting layer. $NH_3$ as the source material of N may be replaced with dimethyl hydrazine in the formation of the light emitting layer.

Next, the substrate temperature is raised again to 1050° C. to successively grow 20 nm thick p type $Al_{0.2}Ga_{0.8}N$ carrier block layer 107, 0.1 μm thick p type GaN light guide layer 108, 0.5 μm thick p type $Al_{0.1}Ga_{0.9}N$ clad layer 109, and 0.1 μm thick p type GaN contact layer 110. As the p-type impurity, Mg ($EtCP_2Mg$: bisethylcyclopentadienyl magnesium) was added at a concentration from $5\times10^{19}/cm^3$ to $2\times10^{20}/cm^3$. The p type impurity concentration in p type GaN contact layer 110 is preferably increased as it approaches the interface with p electrode 112. This can reduce the contact resistance of the p electrode. Further, oxygen may be added by a minute amount during growth of the p type layers, to remove residual hydrogen in the p type layers that hinders activation of the p type impurity Mg.

After the growth of p type GaN contact layer 110, the entire gas in the reactor of the MOCVD system is replaced with nitrogen carrier gas and $NH_9$, and the substrate temperature is decreased at a cooling rate of 60° C. /min. Supply of $NH_3$ is stopped when the substrate temperature is decreased to 800° C. The substrate is maintained at that temperature for five minutes, and then cooled to room temperature. The substrate is temporarily held at a temperature preferably in a range from 650° C. to 900° C., for a time period preferably in a range from 3 minutes to 10 minutes. The cooling rate from the holding temperature is preferably more than 30° C./min. The film thus grown was evaluated by Raman spectroscopy, and it was found that the film already had p type characteristic (with Mg activated) immediately after its growth, even without conventional annealing for p type characteristics carried out in a nitride semiconductor light emitting device. The contact resistance of the p electrode was also reduced. When the conventional annealing for giving p type characteristic was additionally applied, the activation ratio of Mg further improved favorably.

Low-temperature GaN buffer layer 101 of the present embodiment may be a low-temperature $Al_xGa_{1-x}N$ buffer layer ($0 \leq x \leq 1$), or the layer itself may be omitted. With a GaN substrate commercially available at the present, however, it is preferable to insert the low-temperature $Al_xGa_{1-x}N$ buffer layer ($0 \leq x \leq 1$) to improve the unfavorable surface morphology of the GaN substrate. Here, the low-temperature buffer layer refers to a buffer layer formed at a relatively low growth temperature of 450–600° C. The buffer layer formed at a growth temperature in this range becomes polycrystalline or amorphous.

$In_{0.07}Ga_{0.93}N$ anti-crack layer 103 of the present embodiment may have the In composition ratio of other than 0.07, or the layer itself may be omitted. However, the InGaN anti-crack layer is preferably inserted when lattice mismatch between the clad layer and the GaN substrate is large.

Although the light emitting layer described in conjunction with FIG. 1 has the multiple quantum well structure starting and ending both with the barrier layers (see FIG. 11A), it may have a structure starting and ending both with the well layers (see FIG. 11B). The number of well layers is not limited to 3 as described above. The threshold current density is sufficiently low with at most 10 well layers, enabling continuous light emission at room temperature. In particular, the well layers of at least 2 and at most 6 are preferable, ensuring the low threshold current density (see FIG. 9).

While Si ($SiH_4$) has been added in both the well and barrier layers at a concentration of $1 \times 10^{18}/cm^3$ in the light emitting layer of the present embodiment, it may be added to only the barrier layer or none of the layers. This is because the defect density is not high in the film grown using the nitride semiconductor substrate, and thus there is a probability that the adverse effect of light absorption (gain loss) due to the impurity will surpass the desirable effect of improved crystallinity due to the impurity in the light emitting layer. In this case, the dose of the impurity to be added in the light emitting layer is preferably on the order of $1 \times 10^{16}/cm^3$ to $1 \times 10^{19}/cm^3$, and any of O, S, C, Ge, Zn, Cd and Mg, besides Si, may be employed as the impurity.

P type $Al_{0.2}Ga_{0.8}N$ carrier block layer 107 of the present embodiment may have the Al composition ratio of other than 0.2, or the carrier block layer itself may be omitted. The threshold current density, however, was lowered with provision of the carrier block layer, presumably because of its function to confine the carriers in the light emitting layer. The Al composition ratio of the carrier block layer is preferably set high to enhance the carrier confining effect. When the Al composition ratio is set low in the range guaranteeing the carrier confinement, mobility of the carriers in the carrier block layer increases, leading to favorable reduction of electric resistance. Further, since carrier block layer 107 contains Al, it can prevent escape of elements X and Y from the light emitting layer.

Although $Al_{0.1}Ga_{0.9}N$ crystals have been employed for the p type clad layer and the n type clad layer in the present embodiment, the Al composition ratio may be other than 0.1. If the Al composition ratio in the clad layers is increased, the differences in energy gap and refractive index compared with the light emitting layer increase, so that carriers and light can be confined in the light emitting layer efficiently, which leads to reduction of the lasing threshold current density. Further, if the Al composition ratio is lowered in the range ensuring confinement of carriers and light, mobility of the carriers in the clad layers will increase, so that operating voltage of the light emitting device can be reduced.

The AlGaN clad layer preferably has a thickness of 0.7–1.5 μm. This ensures a unimodal vertical transverse mode and increases the light confining effect, and further enables improvement in optical characteristics of the laser and reduction of the threshold current density.

The clad layer is not limited to the ternary system mixed crystal of AlGaN, but it may be a quaternary system mixed crystal of AlInGaN, AlGaNP, or AlGaNAs. Further, the p type clad layer may have a super-lattice structure formed of p type AlGaN layer and p type GaN layer or a super-lattice structure formed of p type AlGaN layer and p type InGaN layer for the purpose of reducing its electric resistance.

Although the C {0001} plane has been explained as the main surface of the GaN substrate in conjunction with FIG. 1, A {11-20} plane, R {1-102} plane, M {1-100} plane or {1-101} plane may also be employed as the main surface of the substrate. A substrate main surface having an off-angle of at most two degrees from any of these plane orientations can cause good surface morphology.

Although the GaN substrate has been used in FIG. 1, a nitride semiconductor substrate other than the GaN substrate may also be employed. In the case of a nitride semiconductor laser, it is preferable that a layer having a lower refractive index than that of a clad layer is provided in contact with the outside of the clad layer to obtain a unimodal vertical transverse mode. As such, an AlGaN substrate may be used preferably.

Although the crystal growth using the MOCVD system has been explained in conjunction with FIG. 1, molecular beam epitaxy (MBE) or hydride vapor phase epitaxy (HVPE) may be used for the crystal growth.

The epi-wafer including the plurality of nitride semiconductor layers stacked as described above is taken out of the MOCVD system and processed to obtain laser devices.

Hf and Au are deposited in this order on the back side of n type GaN substrate 100, to form n electrode 111. Ti/Al, Ti/Mo, Hf/Al or the like may also be used as the materials for the n electrode. Hf is preferably used to decrease the contact resistance of the n electrode.

The p electrode portion is etched in a stripe manner along a <1-100> direction of the nitride semiconductor crystal, to form a ridge stripe portion as shown in FIG. 1. The ridge stripe portion is formed to have a width of 2 in. Thereafter, $SiO_2$ dielectric film 113 is formed by evaporation, and an upper surface of p type GaN contact layer 110 is exposed. On the exposed surface of the contact layer, Pd, Mo and Au are vapor-deposited in this order to form p electrode 112. Pd/Pt/Au, Pd/Au or Ni/Au may also be used as the materials for the p electrode.

Figure 5:
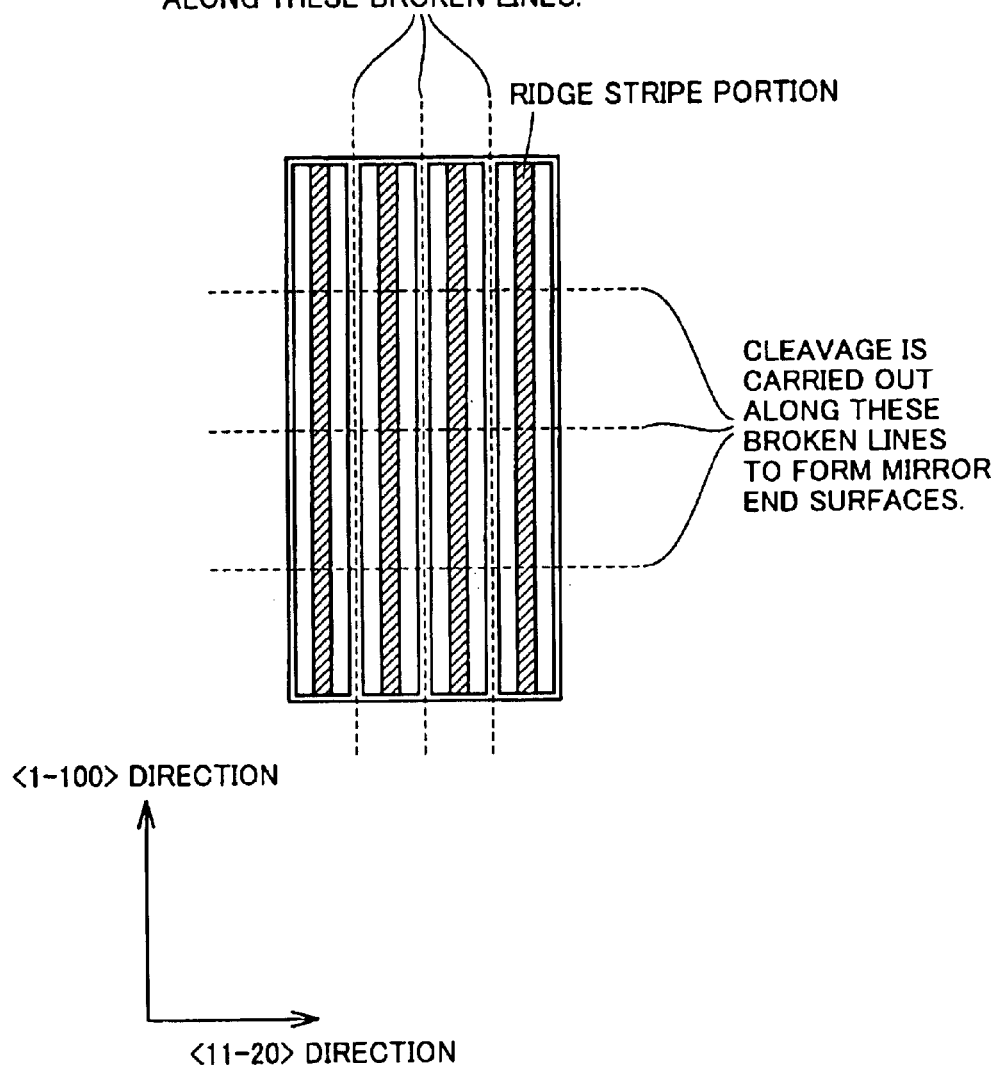
FIG. 5 is a schematic top plan view illustrating chip division of a wafer with laser device structures formed.

Thereafter, Fabri-Perot resonators of 500 μm each in length are formed utilizing the cleavage plane of the GaN substrate. In general, the resonator length is preferably in a range of from 300 μm to 1000 μm. The mirror end surfaces of each resonator are formed parallel to the M plane ({1-100} plane) of the GaN substrate (see FIG. 5). Cleavage for formation of the mirror end surfaces and chip division into laser devices are carried out with a scriber on the substrate side along the broken lines shown in FIG. 5. The cleavage for forming the mirror end surfaces is done with the scriber, by scratching not the entire wafer surface but only portions of the wafer, e.g., only the both ends of the wafer. This prevents degradation of steepness of the end surfaces and also prevents shavings due to the scribing from attaching to the epi-surface, thereby increasing the yield of the laser devices. As the type of the laser resonator, DFB (distributed feedback) type or DBR (distributed bragg reflector) type commonly known may also be employed besides the Fabri-Perot type.

After formation of the mirror end surfaces of the Fabri-Perot resonator, dielectric films of $SiO_2$ and $TiO_2$ are alternately formed on one of the mirror end surfaces by evaporation, to make a dielectric multilayer reflection film having a reflectance of 70%. Alternatively, $SiO_2/Al_2O_3$ may be used as the materials for the dielectric multilayer reflection film.

Figure 4:
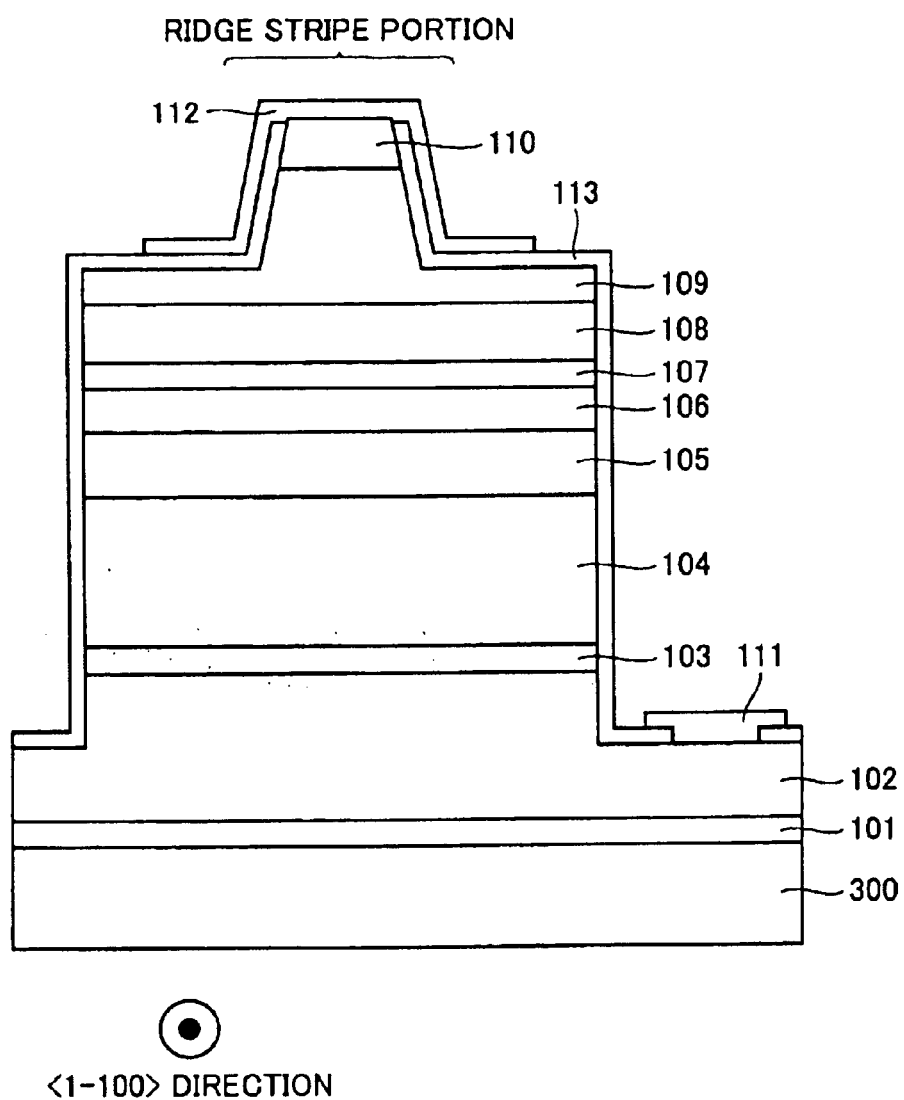
FIG. 4 is a schematic cross sectional view showing, a structure of a nitride semiconductor laser device according to another embodiment of the present invention.

Although n electrode 111 has been formed on the back side of n type GaN substrate 100, alternatively a portion of n type GaN layer 102 may be exposed from the front side of the epi-wafer by dry etching, to form the n electrode on the exposed portion (see FIG. 4).

The method of packaging the nitride semiconductor laser chip is now explained. In the case of using the nitride semiconductor laser device as a high output laser device (of at least 30 mW), the laser chip is connected to a package body using an In soldering material, preferably junction-up, or more preferably junction-down. Alternatively, the nitride semiconductor laser chip may be connected via a sub-mount of Si, AlN, diamond, Mo, CuW, BN, Au, Cu or Fe, instead of being directly attached to the package body or a heat sink portion. The nitride semiconductor laser device of the present embodiment is formed as described above.

Second Embodiment

Figure 2:
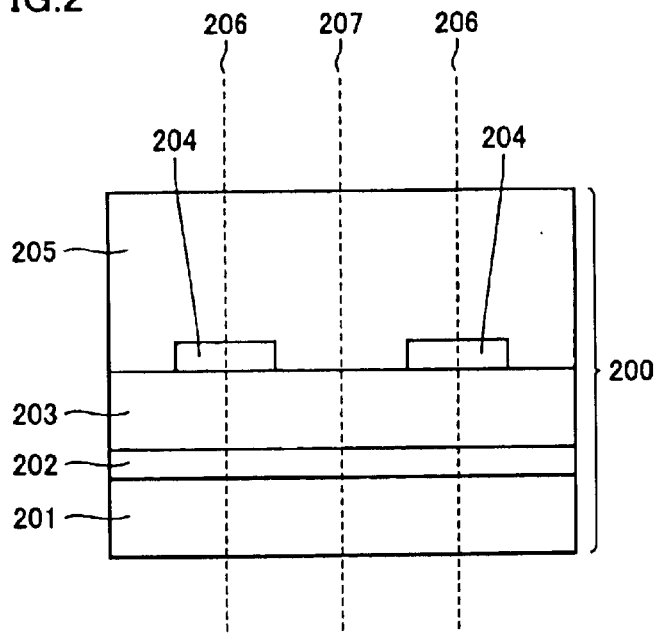
FIG. 2 is a schematic cross sectional view showing a pseudo GaN substrate that can be used in formation of the nitride semiconductor laser device according to the present invention.
Figure 3A:
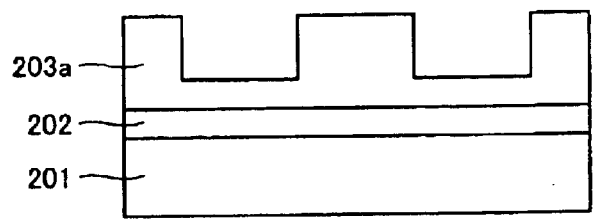
FIG. 3A is a cross sectional view illustrating a process of forming another pseudo GaN substrate.
Figure 3B:
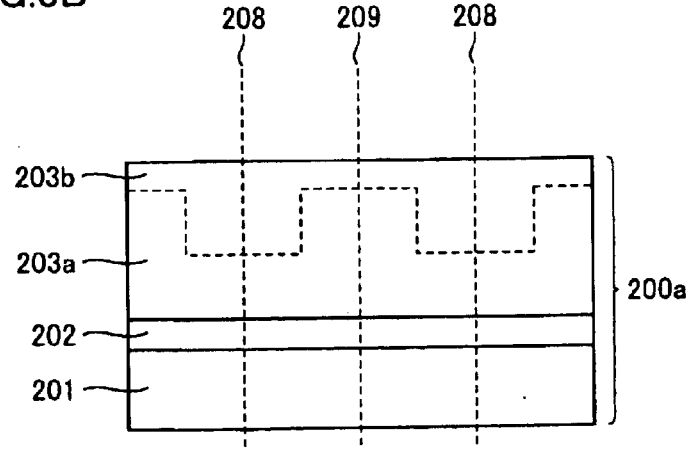
FIG. 3B is a schematic cross sectional view showing the pseudo GaN substrate formed through the process shown in FIG. 3A.

The second embodiment differs from the first embodiment of FIG. 1 only in that GaN substrate 100 is replaced with a pseudo GaN substrate 200 of FIG. 2 or a pseudo GaN substrate 200a of FIG. 3B, and that the n electrode is formed on the front side of the substrate as shown in FIG. 4.

The pseudo GaN substrate 200 of FIG. 2 includes a seed substrate 201, a low-temperature buffer layer 202, an n type GaN film 203, a growth inhibiting film 204, and an n type GaN thick film 205. Seed substrate 201 is used as a base material for growing n type GaN thick film 205. The growth inhibiting film refers to a film restricting crystal growth of the nitride semiconductor film thereon. The pseudo GaN substrate described here refers not only to the one having a structure shown in FIG. 2, but also to any other one including at least a seed substrate and a growth inhibiting film.

The pseudo GaN substrate 200a of FIG. 3B includes a seed substrate 201, a low-temperature buffer layer 202, a first n type GaN film 203a, and a second n type GaN film 203b. In forming pseudo GaN substrate 200a, as shown in FIG. 3A, first n type GaN film 203a is laminated on seed substrate 201, and then the surface of the GaN film is shaped to have grooves by dry etching or wet etching. Thereafter, second n type GaN film 203b is laminated, to complete pseudo GaN substrate 200a (see FIG. 3B). Although the grooves have been formed only to a depth in the middle of first n type GaN film 203a in FIG. 3A, they may be formed to reach into low-temperature buffer layer 202 or into seed substrate 201.

When a nitride, semiconductor film was grown using pseudo GaN substrate 200 or 200a formed as described above, its defect density (etch pit density: less than about $7\times10^7 cm^2$) was lower than in the case of using a sapphire or SiC substrate (etch pit density: more than about $4\times10^8/cm^2$).

In the case of FIG. 2, the defect density was high in regions along a line 206 defining the center in width of growth inhibiting film 204 and along a line 207 defining the center in width of the portion unprovided with the growth inhibiting film. In the case of FIG. 3B, the defect density was high in regions along a line 208 defining the center of a groove and along a line 209 defining the center in width of the portion (hill) unprovided with the groove. That is, the defect density is low in a region between lines 206 and 207 in FIG. 2 and in a region between lines 208 and 209 in FIG. 3B. Accordingly, a light emitting device can be preferably formed in such low defect density regions on the pseudo GaN substrate.

As specific examples of seed substrate 201, it is possible to use C-plane sapphire, M-plane sapphire, A-plane sapphire, R-plane sapphire, GaAs, ZnO, MgO, spinel, Ge, Si, GaN, 6H-SiC, 4H-SiC and 3C-SiC.

As the material for growth inhibiting film 204, it is possible to use dielectric materials such as $SiO_2$, SiN., $TiO_2$ and $Al_2O_3$, and metal films such as a tungsten film. Further, a hollow portion may be formed on growth inhibiting film 204 in FIG. 2. Provision of the hollow portion in n type GaN thick film 205 alleviates crystal strain above the hollow portion, and can accordingly contribute to improvement in luminous efficiency of the light emitting device.

When a conductive SiC or Si substrate is used as the seed substrate, the n electrode may be formed on the back side of the substrate, as shown in FIG. 1. In such a case, however, low-temperature buffer layer 202 should be replaced with a high-temperature buffer layer. Here, the high-temperature buffer layer refers to a buffer layer formed at a growth temperature of at least 900° C. The high-temperature buffer layer needs to contain at least Al; otherwise, it is impossible to form a nitride semiconductor film of good crystallinity over the SiC or Si substrate. The most preferable material for the high-temperature buffer layer is InAlN.

Preferably, the main surface orientation of the seed substrate (in the case of hexagonal system) is C {0001} plane, A {1-20} plane, R {1-102} plane, M {1-100} plane or {1-101} plane. Any main surface of the substrate having an off-angle within two degrees from any of these plane orientations ensures good surface morphology.

A nitride semiconductor laser device using the pseudo GaN substrate is now explained with reference to FIG. 4. This nitride semiconductor laser device includes a substrate 300, a low-temperature GaN buffer layer 101, an n type GaN layer 102, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.9}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113. Substrate 300 is a pseudo GaN substrate. The method of forming this nitride semiconductor laser device is similar to that of the first embodiment, though such packaging as will be described below in the third embodiment is preferable in the case of using the seed substrate ,e.g., of sapphire having poor heat conductivity.

The nitride semiconductor laser device of the present embodiment has a ridge stripe portion (see FIG. 1 or 3) that is formed in a region avoiding lines 206 and 207 in FIG. 2 or lines 208 and 209 in FIG. 3.

Low-temperature GaN buffer layer 101 of the present embodiment may be replaced with a low-temperature $Al_xGa_{1-x}N$ buffer layer ($0 \leq x \leq 1$), or the low-temperature buffer layer itself may be omitted. If the pseudo GaN substrate has poor surface morphology, however, it is preferable to insert the low-temperature $Al_xGa_{1-x}N$ buffer layer ($0 \leq x \leq 1$) to improve the surface morphology.

Pseudo GaN substrate 300 may have its seed substrate 201 removed by a polishing machine. Alternatively, substrate 300 may have low-temperature buffer layer 201 and all the layers thereunder removed by a polishing machine. Further, substrate 300 may have growth inhibiting film 204 and all the layers thereunder removed by a polishing machine. In the case that seed substrate 201 is removed, n electrode 111 may be formed on the surface from which the seed substrate has been removed. Still further, seed substrate 201 may be removed after the nitride semiconductor laser device is formed, on pseudo GaN substrate 300.

Third Embodiment

The third embodiment differs from the embodiment of FIG. 1 only in that the nitride semiconductor laser device is formed on a substrate other than the nitride semiconductor substrate with a nitride semiconductor buffer layer interposed therebetween, and that the n electrode is formed on one side of the substrate as shown in FIG. 4.

Referring to FIG. 4, the nitride semiconductor laser device of the present embodiment includes a substrate 300, a low-temperature GaN buffer layer 101 (thickness: 25 nm), an n type GaN layer 102, an n type $In_{0.07}Ga_{0.93}N$ anti-crack layer 103, an n type $Al_{0.1}Ga_{0.9}N$ clad layer 104, an n type GaN light guide layer 105, a light emitting layer 106, a p type $Al_{0.2}Ga_{0.8}N$ carrier block layer 107, a p type GaN light guide layer 108, a p type $Al_{0.1}Ga_{0.9}N$ clad layer 109, a p type GaN contact layer 110, an n electrode 111, a p electrode 112, and a $SiO_2$ dielectric film 113. Substrate 300 may be, e.g., a C (0001) plane sapphire substrate.

The method of forming this nitride semiconductor laser device is similar as in the first embodiment. In packaging, this laser device is preferably connected with being junction-down to a package body, using an In soldering material or the like. Alternatively, the laser device may be connected via a sub-mount of Si, AlN, diamond, Mo, CuW, BN, Au, Cu or Fe, instead of being directly attached to the package body or a heat sink portion. In the case that substrate 300 is formed of a material such as SiC or Si having high heat conductivity, the laser device may also be mounted junction-up.

Although the sapphire substrate has been employed for substrate 300 in the present embodiment, 6H—SiC, 4H—SiC, 3C—SiC, Si or spinel ($MgAl_2O_4$) may be employed for the substrate. Since the SiC substrate and the Si substrate are conductive, the n electrode may be formed on the back side of the substrate, as shown in FIG. 1. Further, the buffer layer for growing a nitride semiconductor film of good crystallinity over the SiC or Si substrate is such a high-temperature buffer layer as in the second embodiment.

Although the C {10001} plane substrate has been explained in the present embodiment, the main surface orientation of the substrate may also be A {11-20}plane, R {1-102} plane, M {1-100} plane or {1-101} Further, any main surface of the substrate having an off-angle within two degrees from any of these plane orientations enables good surface morphology.

Fourth Embodiment

Figure 6:
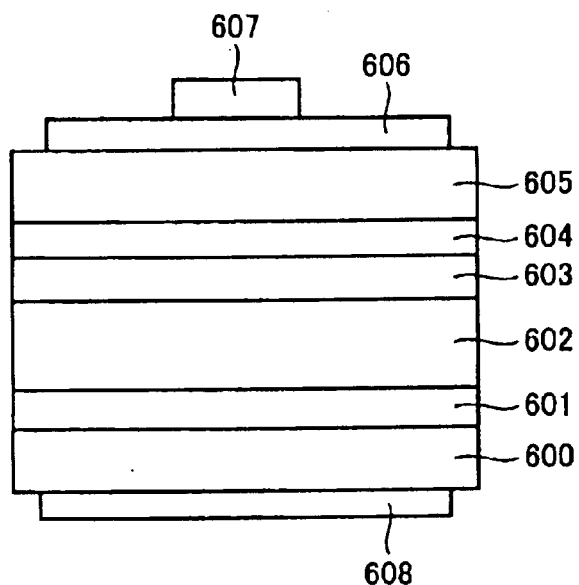
FIG. 6 is a schematic cross sectional view showing a structure of a nitride semiconductor light emitting diode device according to another embodiment of the present invention.

In the fourth embodiment, the case of applying the present invention to a nitride semiconductor light emitting diode device is explained. FIG. 6 shows a cross section of the nitride semiconductor light emitting diode device.

This nitride semiconductor light emitting diode device includes an n type GaN substrate 600 having a C (0001) plane, a low-temperature GaN buffer layer 601 (thickness: 100 nm), an n type GaN layer 602 (thickness: 3 $\mu$m, Si impurity concentration: $1 \times 10^{18}/cm^3$), a light emitting layer 603 (including, e.g., five cycles of $GaN_{0.97}As_{0.03}$ well layers each having a thickness of 3 nm and $GaN_{0.99}As_{0.01}$ barrier layers each having a thickness of 6 nm), a p type $Al_{0.1}Ga_{0.9}N$ carrier block layer 604 (thickness: 20 nm, Mg impurity concentration: $6 \times 10^{19}/cm^3$), a p type GaN contact layer 605 (thickness: 0.1 $\mu$m, Mg impurity concentration: $1 \times 10^{20}/cm^3$), a transparent electrode 606, a p electrode 607, and an n electrode 608.

Figure 7:
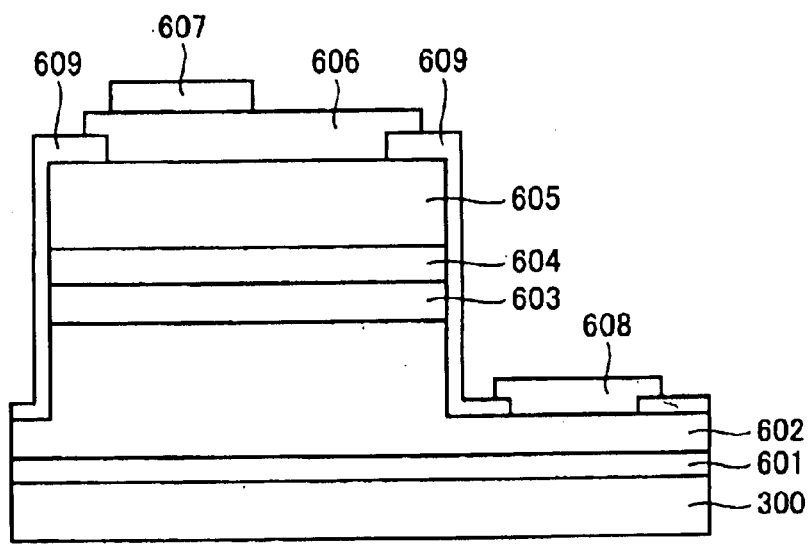
FIG. 7 is a schematic cross sectional view showing a structure of a nitride semiconductor light emitting diode device according to yet another embodiment.

N electrode 608 of the present embodiment is formed by laminating metal layers of Hf and Au in this order on the back side of n type GaN substrate 100. Ti/Al, Ti/Mo or Hf/Al may also be used as the materials of the n electrode. Use of Hf in the n electrode is particularly preferable, since it reduces the contact resistance of the n electrode. Although n electrode 608 of the present embodiment has been formed on the back side of n type GaN substrate 600, a portion of n type GaN layer 602 may be exposed on the p electrode side of the epi-wafer by dry etching, as shown in FIG. 7, and n electrode 608 may be formed on the exposed portion.

On the p electrode side, a Pd film as transparent electrode 606 is formed by evaporation to a thickness of 7 nm, and an Au film as p electrode 607 is also formed by evaporation. Alternatively, the transparent electrode may be formed of Ni, Pd/Mo, Pd/Pt, Pd/Au, or Ni/Au.

Thereafter, chip division is carried out, using a scriber on the back side of n type GaN substrate 600 (opposite to the side on which transparent electrode 606 is formed by evaporation). Scribing is carried out in such a direction that at least one side of the chip includes the cleavage plane of the nitride semiconductor substrate. This prevents abnormality in chip shape due to chipping or cracking, and improves the yield of chips per wafer.

The nitride semiconductor substrate (GaN substrate 600) may be replaced with the pseudo GaN substrate explained in the second embodiment. The nitride semiconductor light emitting diode device in the case of using the pseudo GaN substrate has approximately the same characteristics as in the case of using the nitride semiconductor substrate (see FIG. 10). However, the yield of the light emitting devices is liable to decrease in the case of using the pseudo GaN substrate compared to the case of using the nitride semiconductor substrate, since the pseudo GaN substrate includes coexistent regions of low etch pit density (defect density) and of high etch pit density. On the other hand, the pseudo GaN substrate is advantageous in that it can be formed to have a large area at low costs, compared to the case of the nitride semiconductor substrate. When the pseudo GaN substrate includes an insulative seed substrate, the p electrode and the n electrode may be formed on the same side of the substrate, as shown in FIG. 7.

The nitride semiconductor light emitting diode device may be formed on a substrate other than the nitride semiconductor substrate, with a nitride semiconductor buffer layer interposed therebetween. A specific example of such a device is explained with reference to FIG. 7.

The nitride semiconductor light emitting diode device of FIG. 7 includes a substrate 300, a low-temperature GaN buffer layer 601 (thickness: 25 nm), an n type GaN layer 602 (thickness: 3 ;$\mu$m, Si impurity concentration: $1 \times 10^{18}/cm^3$), a light emitting layer 603 (e.g., five-cycle $GaN_{0.94}P_{0.06}$ well layers/$GaN_{0.99}P_{0.01}$ barrier layers), a p type $Al_{0.1}Ga_{0.9}N$ carrier block layer 604 (thickness: 20 nm, Mg impurity concentration: $6 \times 10^{19}/cm^3$), a p type GaN contact layer 605

(thickness: 0.1 μm, Mg impurity concentration: 1×10²⁰/cm³), a transparent electrode 606, a p, electrode 607, an n electrode 608, and a dielectric film 609. Here, a sapphire substrate is used as the substrate 300. In the case that substrate 300 is a conductive SiC or Si substrate, the n electrode and the p electrode may of course be formed on different sides of the substrate, as shown in FIG. 6. In this case, the buffer layer for enabling growth of a nitride semiconductor film of good crystallinity over the SiC or Si substrate is such a high-temperature buffer layer as in the second embodiment.

Fifth Embodiment

The fifth embodiment is similar to the above-described embodiments except that the present invention is applied to a nitride semiconductor super-luminescent diode device. As to the luminous intensity of this light emitting device, approximately the same results as in the nitride semiconductor light emitting diode device can be obtained (see FIG. 10).

Sixth Embodiment (Light Emitting Layer)

Figure 17:
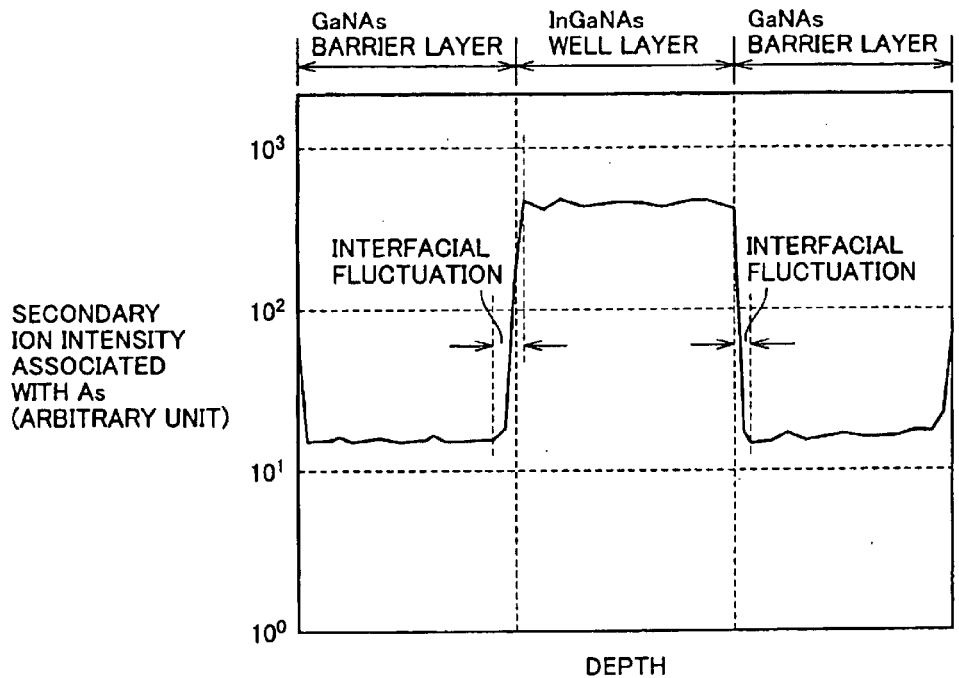
FIG. 17 is a graph showing a SIMS result associated with As in a GaNAs barrier layer/InGaNAs well layer/GaNAs barrier layer structure of the present invention (atomic fraction of As in the GaNAs barrier layer<atomic fraction of As in the InGaNAs well layer).
Figure 18:
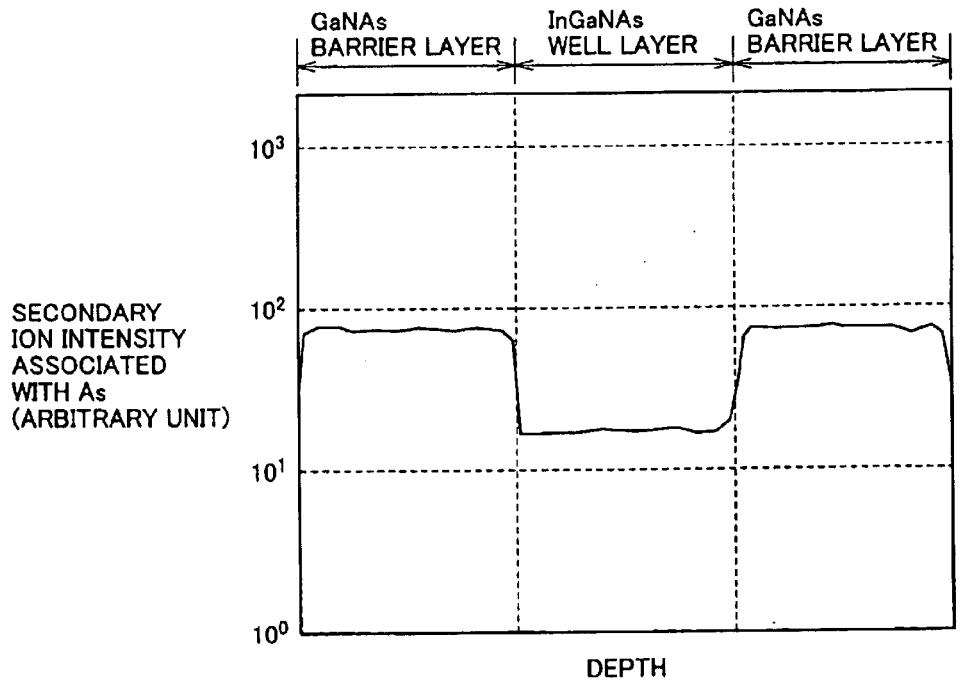
FIG. 18 is a graph showing a SIMS result associated with As in a GaNAs barrier layer/InGaNAs well layer/GaNAs barrier layer structure of the present invention (atomic fraction of As in the GaNAs barrier layer>atomic fraction of As in the InGaNAs well layer).
Figure 19:
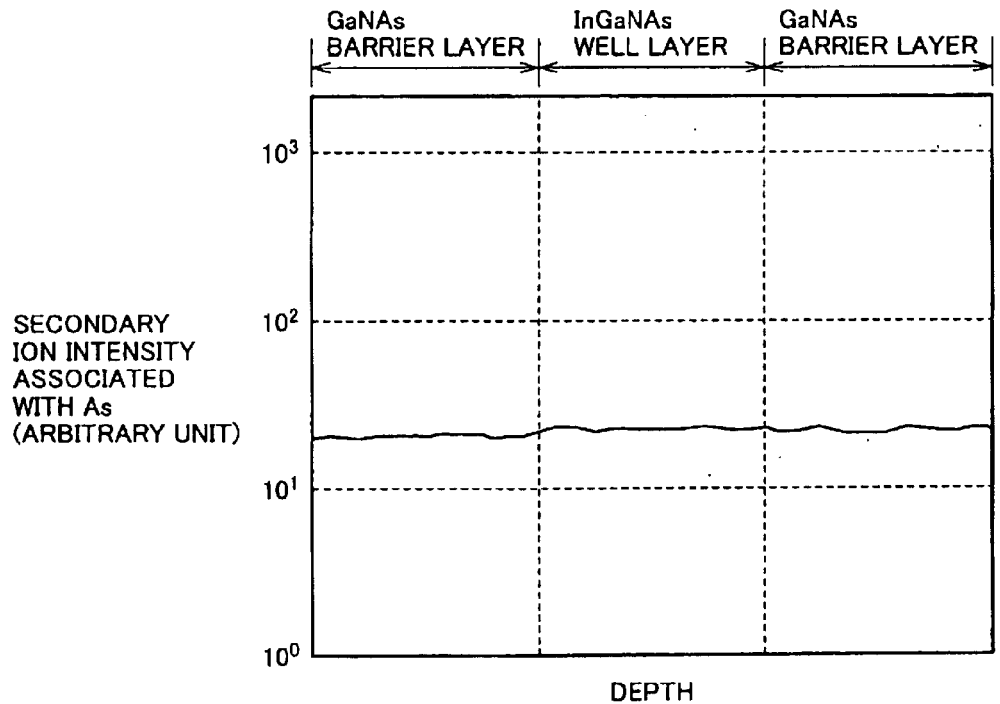
FIG. 19 is a graph showing a SIMS result associated with As in a GaNAs barrier layer/InGaNAs well layer/GaNAs barrier layer structure of the present invention (atomic fraction of As in the GaNAs barrier layer=atomic fraction of As in the InGaNAs well layer).

In the light emitting layer of the sixth embodiment, a GaNY barrier layer is provided in contact with an InGaNX well layer (of which atomic fraction of element X is more than 20%). That is, the sixth embodiment differs from the first embodiment in that the GaNX well layer is replaced with the InGaNX well layer. SIMS results of the InGaNAs well layer/GaNAs barrier layer of the present embodiment are shown in FIGS. 17–19. In these figures, the well and barrier layers were formed at the same growth temperature (800° C.).

Here, FIG. 17 shows the SIMS result in the case that the atomic fraction of As in the GaNAs barrier layer is smaller than that of the InGaNAs well layer. FIG. 18 shows the SIMS result when the atomic fraction of As in the GaNAs barrier layer is greater than that of the InGaNAs well layer. FIG. 19 shows the SIMS result when the GaNAs barrier layer and the InGaNAs well layer have the same. As atomic fraction.

It is understood from these figures that using the barrier layer of the present embodiment can improve the interfacial steepness associated with As. In the case of FIG. 19, it is natural that the secondary ion intensity associated with As is approximately uniform at the interface, since the barrier and well layers are equal in As atomic fraction. These results indicate that it is possible to form a multiple quantum well structure consisting of a plurality of well and barrier layers.

Since the barrier layer of the present embodiment does not contain In, segregation due to In is not generated. The barrier layer not containing In suppresses In segregation in the InGaNX well layer, thereby improving the interfacial steepness of the light emitting layer, for the following reasons. In is highly liable to segregate (coagulate), and readily causes separation Chase separation or concentration separation) of the nitride semiconductor crystal into regions high and low in atomic fraction of In (defined as In/(In+Ga)). In particular, the region with high In atomic fraction is liable to emit no light, thereby degrading luminous efficiency. The inventors have found that probability of occurrence of such phase separation due to In is in proportion to the total dose of In within the entire light emitting layer (well and barrier layers) and to the total volume of the layers containing In. Thus, it is preferable to minimize the In dose in the light emitting layer, and especially preferable to completely eliminate In from the barrier layer as in the present embodiment.

The effect of the present embodiment is obtained not only in the case of the light emitting layer including InGaNAs well layer/GaNAs barrier layer, but also in the case of a light emitting layer including InGaNX well layer/GaNY barrier layer. As specific examples of the InGaNX well layer/GaNY barrier layer, there are InGaNAs well layer/GaNP barrier layer, InGaNAs well layer/GaNSb barrier layer, InGaNAs well layer/GaNAsP barrier layer, InGaNP well layer/GaNP barrier layer, InGaNP well layer/GaNAs barrier layer, InGaNP well layer/GaNSb barrier layer, InGaNP well layer/GaNAsP barrier layer, InGaNSb well layer/GaNSb barrier layer, InGaNSb well layer/GaNAs barrier layer, InGaNSb well layer/GaNP barrier layer, InGaNSb well layer/GaNAsP barrier layer, InGaNAsP well layer/GaNAsP barrier layer, InGaNAsP well layer/GaNAs barrier layer, and InGaNAsP well layer/GaNP barrier layer.

Figure 20:
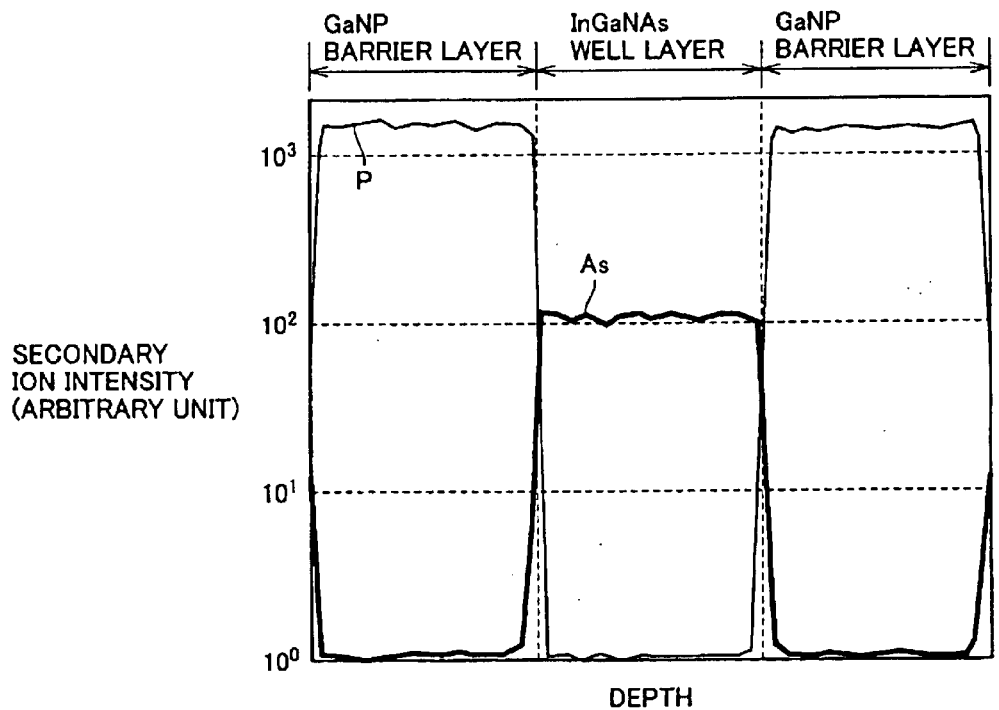
FIG. 20 is a graph showing SIMS results associated with As and P in a GaNP barrier layer/InGaNAs well layer/GaNP barrier layer structure of the present invention.

SIMS results in the case of the light emitting layer including InGaNAs well layer/GaNP barrier layer are shown in FIG. 20,by way of example. It shows that both As in the InGaNAs well layer and P in the GANP barrier layer exhibit steep concentration changes at the interface. The interfacial steepness as in FIG. 20 can be obtained when the light emitting layer includes InGaNP well layer/GaNAs barrier layer.

The ternary system mixed crystal of GaNAs, GaNP or GaNSb in the GaNY barrier layers can be formed with an intended atomic fraction of element Y of the barrier layer with good reproducibility, because the atomic fraction of element Y is readily controllable compared to the quaternary system mixed crystal of GaNAsP. The ternary system mixed crystal also has the favorable characteristics as described in the first embodiment.

Similarly, the quaternary system mixed crystal of InGaNAs, InGaNP or InGaNSb in the InGaNX well layers can make it possible to obtain an intended emission wavelength with good reproducibility, because the atomic fraction of element X is readily controllable compared to the quinary system mixed crystal of InGaNAsP.

Further, in the quaternary system mixed crystals, InGaNP contains P having an atomic radius closest to that of N among P, As and Sb, so that part of N atoms in the mixed crystal is more readily substituted by P atoms compared with As or Sb atoms. Thus, crystallinity of InGaN is unlikely to be impaired by addition of P. That is, even if the atomic fraction of P within InGaNP increases, the crystallinity will not be degraded. Therefore, use of InGaNP for the well layer is advantageous in realizing a wide emission wavelength band from ultraviolet to red. On the other hand, InGaNSb is preferable because it improves crystallinity of the well layer for the same reason as GaNSb described in the first embodiment. InGaNAm is also preferable for the same reason as GaNAs described in the first embodiment.

(Combination of InGaNX Well Layer and GaNY Barrier Layer)

In the light emitting layer of the sixth embodiment, the similar advantages as in the first embodiment can be obtained when element X in the InGaNX well layer and element Y in the GaNX barrier layer are the same element. In addition, the method of forming the light emitting device is further facilitated when elements X and Y are approximately equal in atomic fraction, in which case the interfacial steepness in the light emitting layer is unnecessary, as shown in FIG. 19.

As specific examples of combination of InGaNX well layer and GaNY barrier layer, there are InGaNAs well layer/GaNAs barrier layer, InGaNP well layer/GaNP barrier layer, InGaNSb well layer/GaNSb barrier layer, and InGaNAsP well layer/GaNAsP barrier layer.

(GaNY Barrier Layer)

The bandgap structures as shown in FIGS. 11A and 11B in the first embodiment can similarly be applied to the GaNY barrier layer of the sixth embodiment.

(Dose of Element Y in GaNY Barrier Layer)

Figure 21:
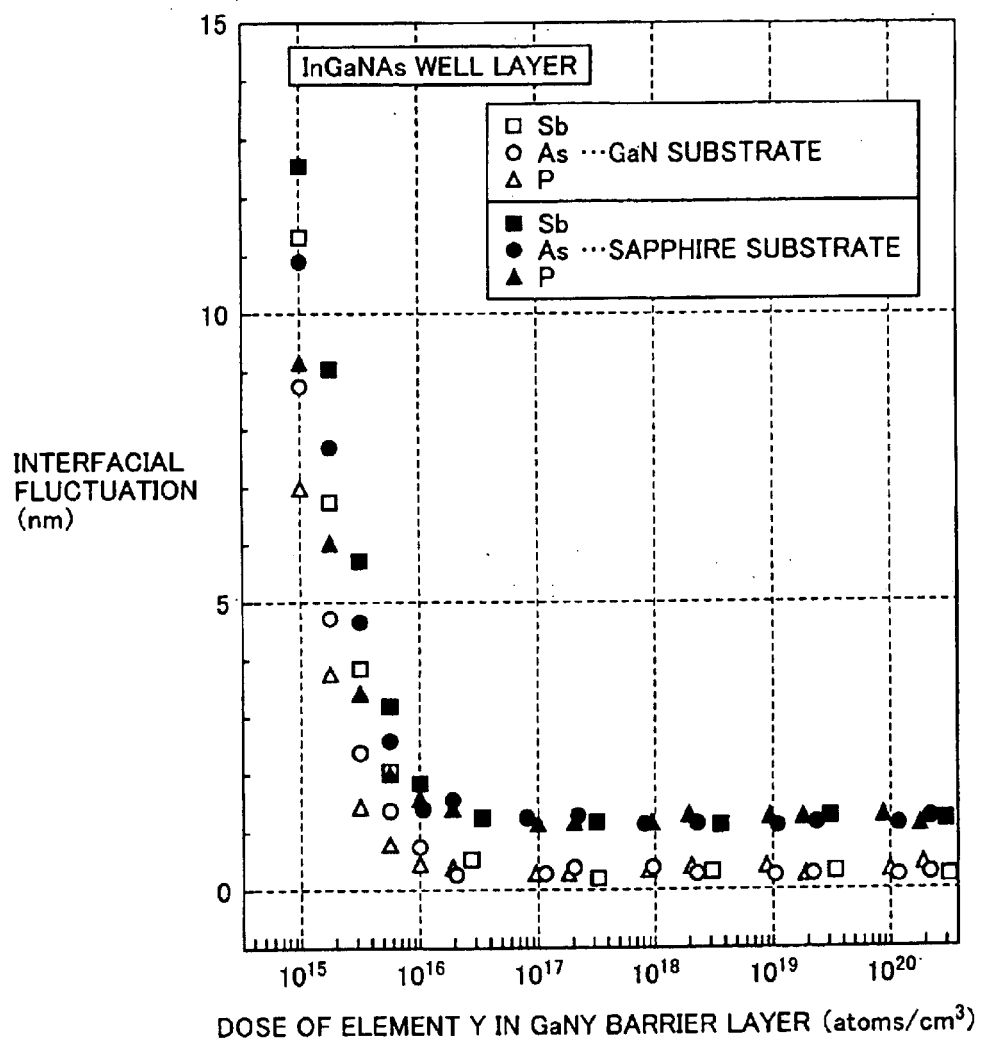
FIG. 21 is a graph showing the relation between the dose of element Y in a GaNY barrier layer in contact with an InGaNAs well layer and the interfacial fluctuation.
Figure 22:
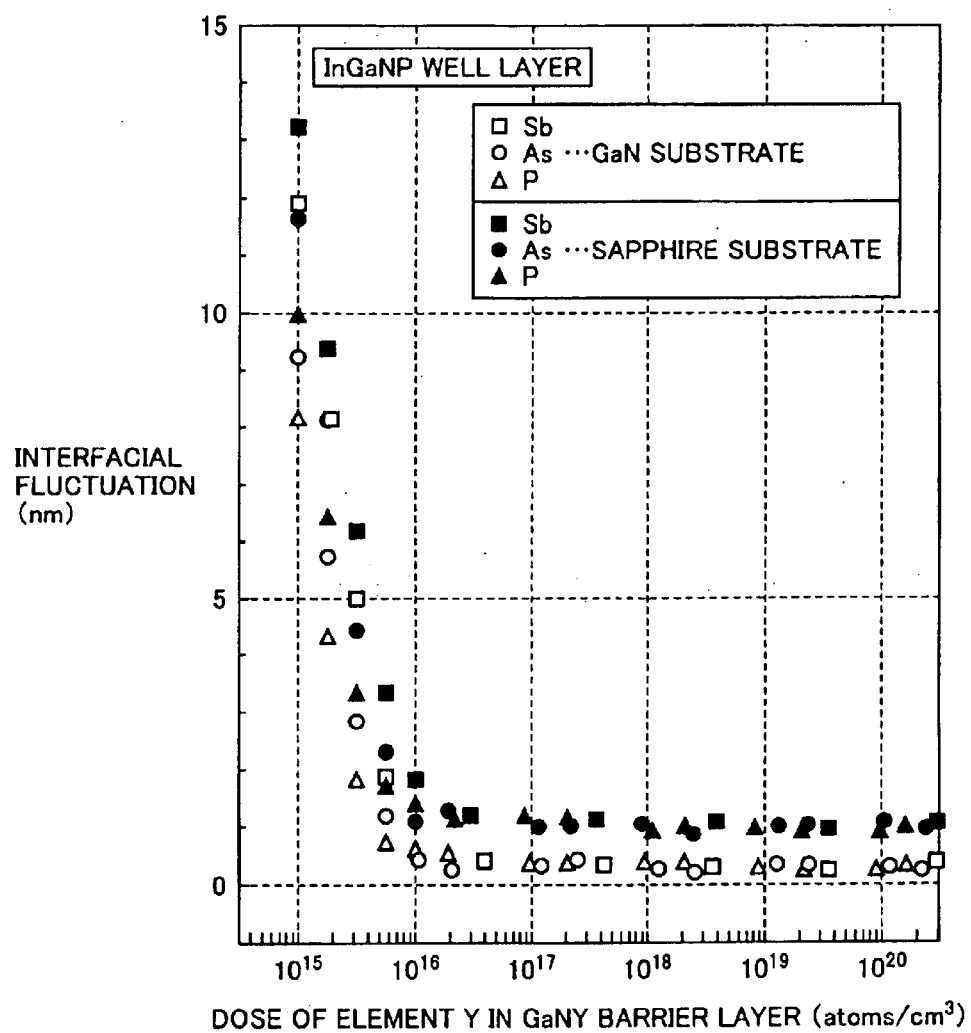
FIG. 22 is a graph showing the relation between the dose of element Y in a GaNY barrier layer in contact with an InGaNP well layer and the interfacial fluctuation.

FIG. 21 shows measurement results regarding the influence of the dose of element Y on the interfacial fluctuation in the GaNY barrier layer/InGaNAs well layer structure. Here, as specific examples of element Y, there are As, P and Sb. Similarly, FIG. 22 shows measurement results regarding the influence of the dose of element Y on the interfacial fluctuation in the GaNY barrier layer/InGaNP well layer structure. Here, the interfacial fluctuation is represented as a depth (thickness) from a point of the maximum secondary ion intensity obtained in the SIMS measurement to another point of the minimum intensity or the other way about (see FIG. 17), similarly as in the first embodiment. In FIGS. 21 and 22, each of the interfacial fluctuations is indicated by a value averaged for such both interfaces as shown in FIG. 17. Black and white marks in FIGS. 21 and 22 represent light emitting layers formed using the sapphire substrate and the GaN substrate, respectively.

According to FIGS. 21 and 22, the interfacial fluctuation can be suppressed when a total dose of element Y is more than $1 \times 10^{16}/cm^3$ (more than $2 \times 10^{-5}\%$ in terms of atomic fraction), irrespective of As, P or Sb, similarly as in the first embodiment. Other effects of addition of element Y in the sixth embodiment are also the same as those in the first embodiment.

(Dose of Element X in InGaNX Well Layer)

The InGaNX well layer has an atomic fraction of element X of less than 20%, preferably less than 15%, and more preferably less than 10%. If the atomic fraction of element X is greater than 15%, phase separation begins to occur where the atomic fraction of element X becomes different in local regions within the well layer, though it depends on the dose of In. When the atomic fraction of element X exceeds 20%, the phase separation proceeds further to cause crystal system separation where a hexagonal system and a cubic system coexist. Such crystal system separation leads to disadvantages as described in the first embodiment. The lower limit of the atomic fraction of element X is at least 0.01%, and preferably at least 0.1%, for the same reasons as in the first embodiment.

(Atomic Fraction of In within InGaNX Well Layer)

In contained in the InGaNX well layer is a preferable element because it can localize carriers to improve luminous efficiency. When the atomic fraction of In increases, however, phase separation may occur due to In, possibly degrading the luminous efficiency.

The atomic fraction of In within the InGaNX well layer can be adjusted in view of the atomic fraction of element X in accordance with an intended emission wavelength (or lasing wavelength) (see, e.g., Table 1 or 2). When the intended emission wavelength is shorter than 470 nm, the atomic fraction of In is preferably from 0.1% to 20%, and more preferably from 0.1% to 10%. If the atomic fraction of In is less than 0.1%, improvement of luminous efficiency attributable to localization of carriers may not be achieved. The atomic fraction of In of less than 20% or further less than 10% preferably reduces the influence of phase separation due to In.

On the other hand, when the intended emission wavelength is longer than 470 nm, the atomic fraction of In is preferably from 1% to 50%, and more preferably from 5% to 35%. If the atomic fraction of In is less than 1%, it is necessary to increase the atomic fraction of element X for the purpose of bandgap adjustment, which may cause phase separation due to element X. Thus, when the intended emission wavelength is greater than 470 nm, the atomic fraction of In is set relatively high. However, in order to minimize the influence of phase separation due to In, the atomic fraction of In is desirably less than 50%, and preferably less than 35%.

(Thickness of Light Emitting Layer)

The preferable thickness ranges of the well and barrier layers in the light emitting layer according to this sixth embodiment are the same as in the first embodiment.

(Substrate for Growing Light Emitting Layer)

The substrate preferably used for formation of the light emitting device of the sixth embodiment is also the same as in the first embodiment.

(Number of Well Layers)

Figure 15:
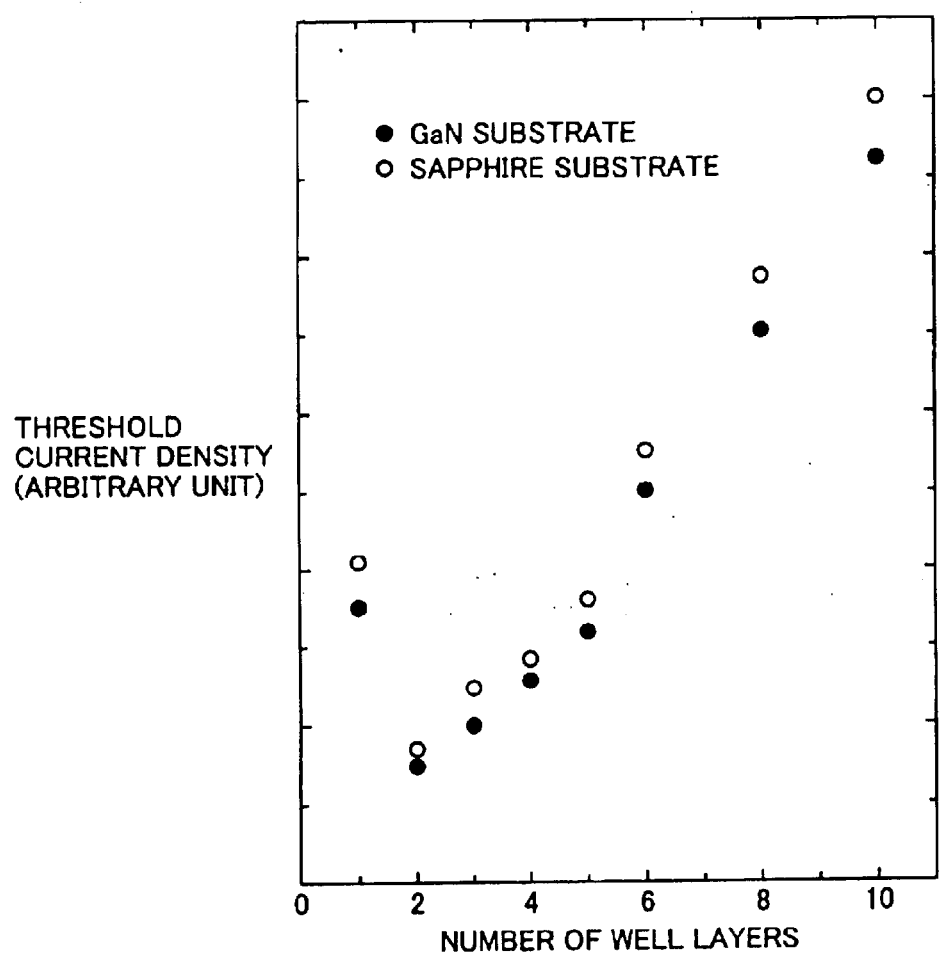
FIG. 15 is a graph showing the relation between the number of well layers and the threshold current density in the nitride semiconductor laser devices according to another embodiment of the present invention.

FIG. 15, similar to FIG. 9, shows the relation between the number of well layers included in the light emitting layer (multiple quantum well structure) of the sixth embodiment and the lasing threshold current density. The light emitting layer in FIG. 15 includes an $In_{0.05}Ga_{0.95}N_{0.98}P_{0.02}$ well layer and a $GaN_{0.99}P_{0.01}$ barrier layer (i.e., the atomic fractions of elements X, Y and In are 2%, 1% and 5%, respectively). In the case of FIG. 15, similarly as in the case of FIG. 9, continuous light-emission at room temperature was possible when the number of well layers was at most 10. The well layers of at least 2 and at most 5 were preferable to further reduce the lasing threshold current density. Although FIG. 15 relates to the light emitting layer containing $In_{0.05}Ga_{0.95}N_{0.98}P_{0.02}$ well layer/$GaN_{0.99}P_{0.01}$ barrier layer, the similar relation as in FIG. 15 can be obtained with any light emitting layer satisfying the requirements of the sixth embodiment.

Figure 16:
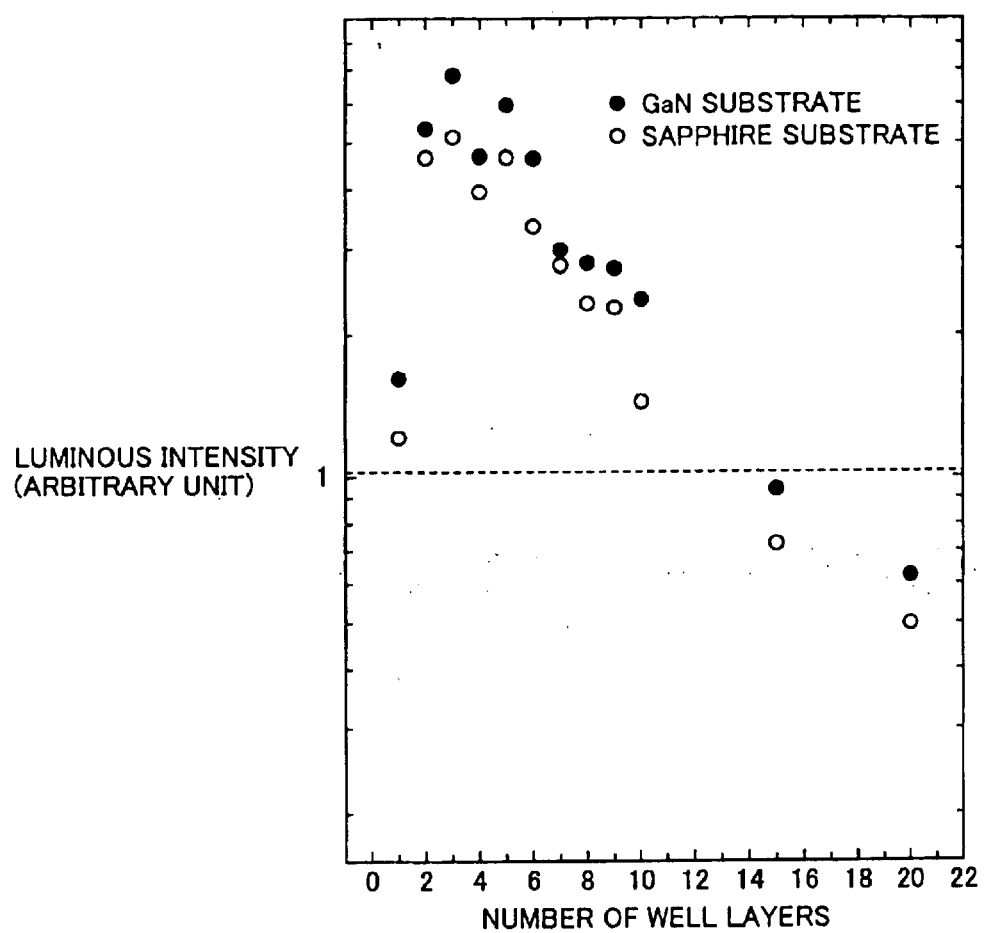
FIG. 16 is a graph showing the relation between the number of well layers and the threshold current density in the nitride semiconductor light emitting diode devices according to another embodiment of the present invention.

Now, explanation is given regarding the relation between the number of well layers included in the multiple quantum well light emitting diode of the sixth embodiment and the luminous intensity, and regarding the influence of a substrate used for formation of that light emitting diode. FIG. 16, similar to FIG. 10, shows the relation between the number of well layers included in the light emitting layer of the sixth embodiment and the luminous intensity. The light emitting layer in FIG. 16 includes an $In_{0.1}Ga_{0.9}N_{0.96}P_{0.04}$ well layer and a $GaN_{0.995}P_{0.005}$ barrier layer. The luminous intensity in FIG. 16 is normalized with the luminous intensity (broken line) of a light emitting diode including a single quantum well layer of $In_{0.1}Ga_{0.9}N_{0.96}P_{0.04}$.

When the conventional light emitting layer ($In_{0.1}Ga_{0.9}N_{0.96}P_{0.04}$ well layer/GaN barrier layer) was replaced with the light emitting layer (number of the well layer was varied from 1 to 20) of the present embodiment and then the luminous intensity was measured, the maximum luminous intensity was about 1.6 times the reference luminous intensity for normalization in FIG. 16. This means that the light emitting layer of the sixth embodiment is superior to the conventional light emitting layer.

Further, as seen from FIG. 16 similar to FIG. 10, the number of well layers ensuring high luminous intensity is preferably at most 10, and more preferably at least 2 and at most 6, irrespective of the kind of substrate. The similar results as in FIG. 16 can be obtained for a super-luminescent diode device. Although FIG. 16 relates to the light emitting layer including $In_{0.1}Ga_{0.9}N_{0.96}P_{0.04}$ well layer/$GaN_{0.995}P_{0.005}$ barrier layer, any other light emitting layer satisfying the requirements of the sixth embodiment can obtain the similar relation of the number of well layers and the luminous intensity as shown in FIG. 16.

(Impurity in Light Emitting Layer)

The InGaNX well layer of the present sixth embodiment is a crystal containing element X, whose atomic fraction of In is low compared to a conventional InGaN well layer, and thus a local energy level due to In is not likely to be generated. Thus, the influence of impurity such as Si added in the light emitting layer of the sixth embodiment on the PL luminous-intensity was similar to the case of the first embodiment.

(Light Emitting Layer and Emission Wavelength)

The emission wavelength of the nitride semiconductor light emitting device of the present sixth embodiment can be changed by adjusting the atomic fraction of element X in the InGaNX well layer. By way of example, Table 1 shows the relation between the emission wavelength and the atomic fraction of As in the case that element X in the InGaNX crystal is As. Further, Table 2 shows the relation between the emission wavelength and the atomic fraction of P in the case that element X in the InGaNX crystal is P. The atomic fractions of In listed in these tables are calculated as In/(n+ Ga) in the InGaNX crystal. Any emission wavelength almost as intended can be obtained by forming the InGaNX well layer with the atomic fraction of element X close to appropriate one shown in Table 1 or 2.

TABLE 1

| Emission Wavelength | Atomic Fraction of In | | | | | | |
|---|---|---|---|---|---|---|---|
| | 1% | 2% | 5% | 10% | 20% | 35% | 50% |
| 380 nm | 0.8 | 0.6 | 0.1 | | | | |
| 400 nm | 2 | 1.8 | 1.3 | 0.4 | | | |
| 410 nm | 2.5 | 2.3 | 1.8 | 1 | | | |
| 470 nm | 5.5 | 5.3 | 4.7 | 3.8 | 2.2 | 0.1 | |
| 520 nm | 7.5 | 7.3 | 6.7 | 5.8 | 4.1 | 1.9 | 0.1 |
| 650 nm | 11.6 | 11.4 | 10.7 | 9.7 | 7.9 | 5.5 | 3.6 |

Atomic fraction (%) in InGaNX when element X = As

TABLE 2

| Emission Wavelength | Atomic Fraction of In | | | | | | |
|---|---|---|---|---|---|---|---|
| | 1% | 2% | 5% | 10% | 20% | 35% | 50% |
| 380 nm | 0.5 | 0.4 | 0.1 | | | | |
| 400 nm | 1.2 | 1.1 | 0.8 | 0.3 | | | |
| 410 nm | 1.6 | 1.5 | 1.1 | 0.6 | | | |
| 470 nm | 3.4 | 3.3 | 2.9 | 2.4 | 1.4 | 0.1 | |
| 520 nm | 4.6 | 4.5 | 4.1 | 3.6 | 2.5 | 1.2 | 0.1 |
| 650 nm | 7 | 6.9 | 6.5 | 5.9 | 4.8 | 3.4 | 2.3 |

Atomic fraction (%) in InGaNX when element X = P

In the conventional InGaN well layer, it was necessary to increase the atomic fraction of In to realize light emission of long wavelengths (of, e.g., green and red). By comparison, since the InGaNX well layer contains element X contributable to bandgap adjustment, the atomic fraction of In can be restricted to be low. This is preferable for suppression of phase separation due to In and for improvement of luminous efficiency.

(Light Emitting Layer and Half-Width of Emission Peak)

The half-width of emission peak in the case that the light emitting layer of the sixth embodiment is applied to the light emitting diode of the fourth embodiment is similar to that in the case that the light emitting layer of the first embodiment is applied to the light emitting diode of the fourth embodiment. More specifically, in the vicinity of the wavelengths from 450 nm to 480 nm corresponding to blue light emission, the half-width of emission peak was 65 nm in the conventional light emitting layer containing InGaNAs well layer/GaN barrier layer, but it was 40 nm in the light emitting layer containing InGaNAs well layer/GaNAs barrier layer.

(Method of Forming Nitride Semiconductor Laser Device)

As a method of forming the nitride semiconductor laser device of the present sixth embodiment, the method explained with reference to FIG. 1 in the first embodiment is applicable without substantial changes. In this case, light emitting layer 106 may include, e.g., 4 nm thick $In_{0.05}Ga_{0.95}N_{0.98}P_{0.02}$ well layers and 8 nm thick $GaN_{0.98}P_{0.02}$ barrier layers. As seen from FIG. 15, the number of well layers in the light emitting layer of at most 10 ensures low threshold current density and enables continuous light emission at room temperature. In particular, the well layers of at least 2 and at most 5 advantageously decrease the threshold current density.

The light emitting layer of the present sixth embodiment can also be applied, without substantial changes, to the light emitting layer of the nitride semiconductor laser device described with reference to FIG. 4, in which case the similar effects as in the laser device of FIG. 4 can be obtained.

The light emitting layer of the sixth embodiment can also be applied, without substantial changes, to the light emitting layers of the nitride semiconductor light emitting diode devices described with reference to FIGS. 6 and 7, providing the similar effects as in the light emitting diode devices in FIGS. 6 and 7. In such cases, the light emitting layer of the device shown in FIG. 6 can include, e.g., 5-cycle $In_{0.05}Ga_{0.95}N_{0.97}P_{0.03}$ well layers (3 nm)/$GaN_{0.99}P_{0.01}$ barrier layers (6 nm), and the light emitting layer of the device shown in FIG. 7 can include, e.g., 5-cycle $In_{0.05}Ga_{0.95}N_{0.95}P_{0.05}$ well layers/$GaN_{0.99}P_{0.01}$ barrier layers. Further, the light emitting layer of the sixth embodiment can also be applied to a nitride semiconductor superluminescent diode device without substantial changes. In this case, again, the similar effects as shown in FIG. 16 can be obtained.

Seventh Embodiment

In the seventh embodiment, one of the nitride semiconductor lasers in the above embodiments is applied to an optical apparatus. The GaNX or InGaNX well layer of the present invention includes at least one element selected from As, P and Sb as element X. Inclusion of this element X in the well layer can reduce the effective mass of electrons and holes in the well layer, thereby increasing mobility of the electrons and holes. A smaller effective mass means that carrier population inversion for lasing can be obtained by introducing a smaller amount of current. The smaller effective mass also means that, even if electrons and holes in the light emitting layer are lost due to recombination, electrons and holes can be newly introduced rapidly by diffusion. That is, it is considered that the nitride semiconductor laser device containing element X is superior in self-sustained pulsation characteristics (or noise characteristics) and has low threshold current density, compared to a conventional InGaN base nitride semiconductor laser device of which well layer does not contain element X at all. However, such reduction of threshold current and improvement of luminous intensity has not been achieved sufficiently by any conventional nitride semiconductor light emitting device even including a well layer containing element X because the interfacial steepness between the well and barrier layers was impaired.

In the present invention, GaNY is used for the barrier layer in contact with the GaNY or InGaNX well layer. This can improve the interfacial steepness, and hence enables formation of a multiple quantum well structure of good quality. Then, it becomes possible to realize reduction of threshold current density and accompanying higher output and longer life of the semiconductor laser, and to obtain a semiconductor laser excellent in noise characteristics. For example, when a nitride semiconductor laser of violet color (wavelengths of 380–420 nm) is formed according to the present invention, it exhibits a low lasing threshold current density and strong resistance to noise, compared to a conventional InGaN based nitride semiconductor laser. Further, the laser device of the present invention can operate stably at high output (50 mW) and at high temperature (60° C.), so that it is suitably applicable to a high-density recording/reproducing optical disk (shorter laser wavelength enables recording/reproduction of higher density).

Figure 8:
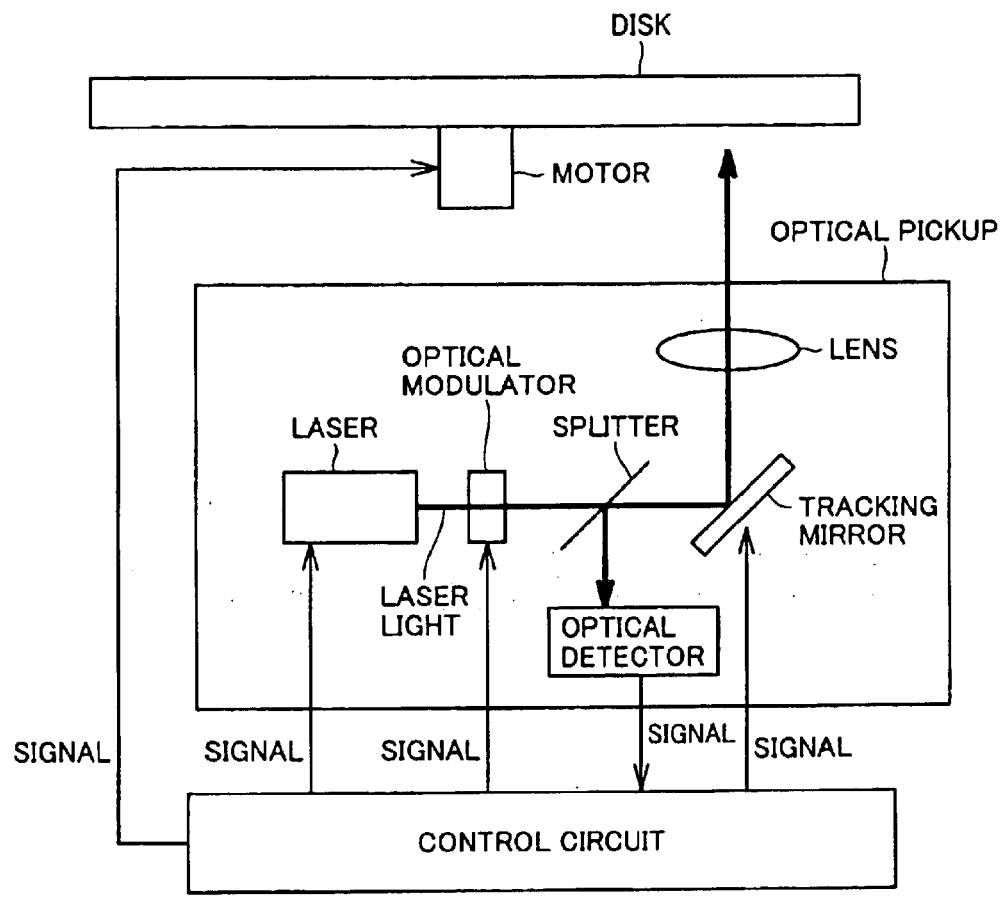
FIG. 8 is a schematic block diagram of an optical disk apparatus including the nitride semiconductor laser device of the present invention.

FIG. 8 is a schematic diagram of the optical disk device including the nitride semiconductor laser device of the present invention. In FIG. 8, laser light is modulated by an optical modulator in accordance with input information, and is collected on a disk via a lens. Thus, the input information is recorded on the disk as pit arrangement. In the case of reproduction, laser light optically influenced by the pit arrangement on the disk is detected by an optical detector via a splitter, and the detected light is converted to a reproduction signal. The recording and reproducing operations are controlled by a control circuit. In general, the laser output is on the order of 30 mW upon recording and on the order of 5 mW upon reproduction. The nitride semiconductor laser device of the present invention is also-applicable to a laser printer, a bar code reader, a projector including laser devices of three primary colors (blue, green, red), and others.

Eighth Embodiment

In the eighth embodiment, the nitride semiconductor light emitting diode devices according to the above embodiments are applied to a light emitting apparatus (e.g., display apparatus or white light source apparatus).

The nitride semiconductor light emitting diode devices can be used for a display apparatus including at least one of optical three primary colors (red, green, blue). In the case of an amber light emitting diode device employing a conventional InGaN based nitride semiconductor, the atomic fraction of In is high, causing considerable phase separation due to In. Therefore, such an amber light emitting diode did not reach the level for commercialization from the standpoints of reliability and luminous intensity. Element X included in the light emitting layer (especially the well layer) of the present invention serves to reduce the bandgap energy of the well layer as does In. Thus, it is considered that a favorable light emitting layer can be obtained by including element X into the well layer, as it reduces the atomic fraction of In. However, in the nitride semiconductor light emitting device of the prior art having a well layer containing element X, interfacial steepness between the well and barrier layers is liable to be impaired, making it difficult to achieve the effect of fully improving luminous intensity and the like.

In the present invention, GaNY is employed for the barrier layer in contact with the GaNX or InGaNY well layer, which improves the interfacial steepness between the well and barrier layers. Such improvement in turn enables formation of a multiple quantum well structure of good quality, and accordingly it becomes possible to form a light emitting diode or a super-luminescent diode that can emit light of various wavelengths at high intensity with less color mottling.

The nitride semiconductor light emitting diode device according to the present invention can be used as one of light emitting diodes generating optical three primary colors, and also used in a white light source apparatus. Further, fluorescent coating may be applied to a nitride semiconductor light emitting diode device of the present invention that can emit light in a range of ultraviolet region to purple region (on the order of 360 nm to 420 nm), to form a white light source apparatus. This white light source apparatus can be utilized as a high-luminance backlight consuming less power, in place of a halogen light source conventionally employed for a liquid crystal display. In other words, it can be used as a backlight for a liquid display in a man-machine interface of a portable notebook computer or a portable telephone, realizing a compact and high-definition liquid crystal display.

INDUSTRIAL APPLICABILITY

In a nitride semiconductor light emitting device having a light emitting layer including a GaNX or InGaNX well layer and a GaNY barrier layer in contact with the well layer, the element X includes at least one element selected from As, P and Sb, with the atomic fraction X/(N+X) of less than 20%, and the element Y includes at least one element selected from As, P and Sb. Accordingly, it becomes possible to obtain the nitride semiconductor light emitting device improved in interfacial steepness between the well and barrier layers and having a low threshold current density or a strong luminous intensity.

What is claimed is:

1. A nitride semiconductor light emitting device formed on a substrate, comprising a light emitting layer including a quantum well layer and a barrier layer in contact with said well layer, wherein said quantum well layer is formed of a nitride semiconductor containing Ga, N and an element X said element X including at least one element selected from As, P and Sb, said well layer has an atomic fraction X/(N+X) of less than 30%, said barrier layer is formed of a nitride semiconductor containing Ga, N and an element Y, said element Y including at least one element selected from As, P and Sb, said barrier layer has an atomic fraction Y/(N+Y) of less than 15%, and said barrier layer has a thickness of more than 1 nm and less than 40 nm, said substrate is a pseudo GaN substrate including a GaN substrate layer grown to cover a main surface of a seed substrate and a plurality of stripe-shaped growth inhibiting films formed thereon, said growth inhibiting films serving to restrict growth of said GaN substrate layer, and wherein said light emitting device includes a ridge stripe portion for narrowing current, said ridge stripe portion being formed avoiding a portion above the center in width of said stripe-shaped growth inhibiting film and a portion above the center in width of a region unprovided with said growth inhibiting film.

2. The nitride semiconductor light emitting device according to claim 1, wherein said element X and said element Y are the same element.

3. The nitride semiconductor light emitting device according to claim 1, wherein a dose of said element Y is more than $1 \times 10^{16}/cm^3$.

4. The nitride semiconductor light emitting device according to claim 1, wherein said seed substrate is a nitride semiconductor substrate.

5. The nitride semiconductor light emitting device according to claim 4, wherein said substrate has an etch pit density of less than $7\times10^7/cm^2$.

6. The nitride semiconductor light emitting device according to claim 1, wherein said well layer has a thickness of more than 0.4 nm and less than 20 nm.

7. The nitride semiconductor light emitting device according to claim 1, wherein said light emitting layer contains at least one impurity selected from Si, O, S, C, Ge, Zn, Cd and Mg, and a total dose of the impurity is more than $1\times10^{16}/cm^3$ and less than $1\times10^{20}/cm^3$.

8. The nitride semiconductor light emitting device according to claim 1, wherein number of said well layers is at most 10.

9. The nitride semiconductor light emitting device according to claim 1, wherein said well layer further includes In, and said atomic fraction X/(N+X) is less than 20%.

10. The nitride semiconductor light emitting device according to claim 9, wherein said element X and said element Y are the same element.

11. The nitride semiconductor light emitting device according to claim 10, wherein an atomic fraction Y/(N+Y) is equal to the atomic fraction X/(N+X).

12. The nitride semiconductor light emitting device according to claim 9, wherein an atomic fraction Y/(N+Y) is more than $2\times10^{-5}$%.

13. The nitride semiconductor light emitting device according to claim 9, wherein said substrate is a nitride semiconductor substrate or a pseudo GaN substrate.

14. The nitride semiconductor light emitting device according to claim 13, wherein said substrate has an etch pit density of less than $7\times10^7/cm^2$.

15. The nitride semiconductor light emitting device according to claim 9, wherein said well layer has a thickness of more than 0.4 nm and less than 20 nm.

16. The nitride semiconductor light emitting device according to claim 9, wherein said light emitting layer contains at least one impurity selected from Si, O, S, C, Ge, Zn, Cd and Mg, and a total dose of said impurity is more than $1\times10^{16}cm^3$ and less than $1\times10^{20}/cm^3$.

17. The nitride semiconductor light emitting device according to claim 9, wherein number of said well layers is at least 2 and at most 10.

18. An optical pickup apparatus including the nitride semiconductor light emitting device of claim 1, comprising a nitride semiconductor laser device having a laser wavelength of more than 380 nm and less than 420 nm.

19. A white light source apparatus including the nitride semiconductor light emitting device of claim 1, comprising a light emitting diode device or a super-luminescent diode device having an emission wavelength of more than 380 nm and less than 420 nm.

20. A display apparatus including the nitride semiconductor light emitting device of claim 1, comprising a light emitting diode device having an emission wavelength of more than 450 nm and less than 480 nm and a half-width of emission peak of less than 40 nm.

21. A method of forming the nitride semiconductor light emitting device of claim 1, wherein said well layer and said barrier layer are grown by metalorganic chemical vapor deposition, and a growth break interval of at least one second and at most 180 seconds is provided between growth of said well layer and growth of said barrier layer.

22. A nitride semiconductor light emitting device formed on a substrate, comprising a light emitting layer including a quantum well layer and a barrier layer in contact with said well layer, wherein said quantum well layer is formed of a nitride semiconductor containing Ga, N and an element X, said element X including at least one element selected from As, P and Sb, said well layer has an atomic faction X/(N+X) of less than 30%, said barrier layer is formed of a nitride semiconductor containing Ga, N and an element Y, said element Y including at least one element selected from As, P and Sb, said barrier layer has an atomic fraction Y/(N+Y) of less than 15%, and said barrier layer has a thickness of more than 1 nm and less than 40 nm, wherein said substrate is a nitride semiconductor substrate or a pseudo GaN substrate and said substrate has an etch pit density of less than $7\times10^7/cm^2$.

23. An optical pickup apparatus including the nitride semiconductor light emitting device of claim 22, comprising a nitride semiconductor laser device having a laser wavelength of more than 380 nm and less than 420 nm.

24. A white light source apparatus including the nitride semiconductor light emitting device of claim 22, comprising a light emitting diode device or a super-luminescent diode device having an emission wavelength of more than 380 nm and less than 420 nm.

25. A display apparatus including the nitride semiconductor light emitting device of claim 22, comprising a light emitting diode device having an emission wavelength of more than 450 nm and less than 480 nm and a half-width of emission peak of less than 40 nm.

26. A nitride semiconductor light emitting device formed on a substrate, comprising a light emitting layer including a quantum well layer and a barrier layer in contact with said well layer, wherein said quantum well layer is formed of a nitride semiconductor containing Ga, N and an element X, said element X including at least one element selected from As, P and Sb, said well layer has an atomic fraction X/(N+X) of less than 30%, said barrier layer is formed of a nitride semiconductor containing Ga, N and an element Y, said element Y including at least one element selected from As, P and Sb, said barrier layer has an atomic fraction Y/(N+Y) of less than 15%, and said barrier layer has a thickness of more than 1 nm and less than 40 nm, said substrate is a pseudo GaN substrate including a GaN substrate layer grown to cover a plurality of stripe-shaped grooves and hills formed on a main surface of a seed substrate, and wherein said light emitting device includes a ridge stripe portion for narrowing current, said ridge stripe portion being formed avoiding a portion above the center in width of said stripe-shaped groove and a portion above the center in width of said stripe-shaped hill.

27. An optical pickup apparatus including the nitride semiconductor light emitting device of claim 26, comprising a nitride semiconductor laser device having a laser wavelength of more than 380 nm and less than 420 nm.

28. A white light source apparatus including the nitride semiconductor light emitting device of claim 26, comprising a light emitting diode device or a super-luminescent diode device having an emission wavelength of more than 380 nm and less than 420 nm.

29. A display apparatus including the nitride semiconductor light emitting device of claim 26, comprising a light emitting diode device having an emission wavelength of more than 450 nm and less than 480 nm and a half-width of emission peak of less than 40 nm.

30. The nitride semiconductor light emitting device according to claim 26, wherein said well layer further includes In, and said atomic fraction X/(N+X) is less than 20%.

31. The nitride semiconductor light emitting device according to claim 22, wherein said well layer further includes In, and said atomic fraction X/(N+X) is less than 20%.

32. The nitride semiconductor light emitting device according to claim 26, wherein said seed substrate is a nitride semiconductor.

* * * * *